United States Patent
Carcasi et al.

(10) Patent No.: US 11,637,031 B2
(45) Date of Patent: Apr. 25, 2023

(54) SYSTEMS AND METHODS FOR SPIN PROCESS VIDEO ANALYSIS DURING SUBSTRATE PROCESSING

(71) Applicant: Tokyo Electron Limited, Tokyo (JP)

(72) Inventors: Michael Carcasi, Austin, TX (US); Joshua Hooge, Austin, TX (US); Mark Somervell, Hillsboro, OR (US); Hiroyuki Iwaki, Tokyo (JP); Masahide Tadokoro, Kumamoto (JP); Masashi Enomoto, Kumamoto (JP); Joel Estrella, Austin, TX (US); Yuichiro Kunugimoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 193 days.

(21) Appl. No.: 17/037,131

(22) Filed: Sep. 29, 2020

(65) Prior Publication Data

US 2021/0134637 A1    May 6, 2021

Related U.S. Application Data

(60) Provisional application No. 62/957,481, filed on Jan. 6, 2020, provisional application No. 62/935,162, filed (Continued)

(51) Int. Cl.
*H01L 21/68* (2006.01)
*B05D 1/00* (2006.01)
(Continued)

(52) U.S. Cl.
CPC .......... *H01L 21/681* (2013.01); *B05B 12/084* (2013.01); *B05D 1/005* (2013.01);
(Continued)

(58) Field of Classification Search
CPC ... G06T 7/13; G06T 7/73; G06T 2207/30148; G06T 7/0004; G01N 2021/8427;
(Continued)

(56) References Cited

U.S. PATENT DOCUMENTS 6,493,078 B1    12/2002  Fitzsimmons
6,680,078 B2    1/2004   Davlin
(Continued)

FOREIGN PATENT DOCUMENTS

AU    2007289367 A1 *  2/2009  ............ B05C 11/02
JP    2006049630 A     2/2006
(Continued)

OTHER PUBLICATIONS

U.S. Appl. No. 17/341,105, filed Jun. 7, 2021.
(Continued)

*Primary Examiner* — Pinalben Patel
(74) *Attorney, Agent, or Firm* — Slater Matsil, LLP

(57) ABSTRACT

Camera images may be utilized to detect substrate edges and provide information regarding the centering of the substrate within the fluid dispense system. Camera images may also be utilized to monitoring the location of a cup within the fluid dispense system. The signal processing techniques utilized may include data smoothing, analyzing only certain wavelengths of reflected energy, transforming the data (in one embodiment utilizing a Fourier transform), and/or analyzing a sub-set of the collected pixels of data. The camera image data collected herein may be combined with a wide variety of other data so as to better monitor, characterize and/or control a substrate processing process flow.

19 Claims, 21 Drawing Sheets

Related U.S. Application Data on Nov. 14, 2019, provisional application No. 62/930,087, filed on Nov. 4, 2019.

(51) Int. Cl.
*G06T 7/13* (2017.01)
*G06T 7/00* (2017.01)
*G06T 7/73* (2017.01)
*B05B 12/08* (2006.01)
*G01N 21/95* (2006.01)
*H01L 21/67* (2006.01)
*H01L 21/66* (2006.01)
*G01N 21/84* (2006.01)

(52) U.S. Cl.
CPC ....... *G01N 21/9501* (2013.01); *G06T 7/0004* (2013.01); *G06T 7/13* (2017.01); *G06T 7/73* (2017.01); *H01L 21/6715* (2013.01); *H01L 21/67253* (2013.01); *H01L 22/12* (2013.01); *G01N 2021/8427* (2013.01); *G06T 2207/30148* (2013.01)

(58) Field of Classification Search
CPC .. G01N 21/9501; B05D 1/005; H01L 21/681; H01L 21/67253; H01L 21/6715; H01L 22/12; B05B 12/084
See application file for complete search history.

(56) References Cited

U.S. PATENT DOCUMENTS

| | | | |
|---|---|---|---|
| 6,693,708 B1 | 2/2004 | Hunter | |
| 6,707,545 B1 | 3/2004 | Hunter | |
| 6,721,045 B1 | 4/2004 | Hunter | |
| 6,818,064 B2 | 11/2004 | Baker | |
| 7,012,684 B1 | 3/2006 | Hunter | |
| 7,486,878 B2* | 2/2009 | Chen | H01L 21/681 396/419 |
| 7,497,026 B2 | 3/2009 | Herchen | |
| 7,670,643 B2 | 3/2010 | Winter | |
| 2011/0054659 A1* | 3/2011 | Carlson | H01L 21/67253 700/109 |
| 2013/0334172 A1* | 12/2013 | Matsumoto | H01L 21/67051 216/85 |
| 2015/0147827 A1* | 5/2015 | deVilliers | G03F 7/70991 438/795 |
| 2019/0172737 A1 | 6/2019 | Endo et al. | |
| 2019/0217325 A1 | 7/2019 | Devilliers | |
| 2019/0217326 A1 | 7/2019 | Devilliers | |
| 2019/0287793 A1 | 9/2019 | Devilliers | |
| 2022/0005736 A1* | 1/2022 | Naohara | H01L 21/67253 |

FOREIGN PATENT DOCUMENTS

| | | |
|---|---|---|
| JP | 2013110270 A | 6/2013 |
| JP | 5431172 B2 | 3/2014 |
| KR | 200287420 Y1 | 8/2002 |
| WO | 0229390 W | 4/2002 |

OTHER PUBLICATIONS

U.S. Appl. No. 17/349,538, filed Jun. 16, 2021.
U.S. Appl. No. 17/037,142, filed Sep. 29, 2020.
U.S. Appl. No. 17/037,007, filed May 6, 2021.
U.S. Appl. No. 17/037,094, filed Sep. 29, 2020.
U.S. Appl. No. 17/037,111, filed Sep. 29, 2020.
U.S. Appl. No. 17/037,117, filed Sep. 29, 2020.
U.S. Appl. No. 17/192,520, filed Mar. 4, 2021.
Korean Intellectual Property Office, The International Search Report and the Written Opinion for International application No. PCT/US2020/053373, dated Jan. 19, 2021, 12 pg.

* cited by examiner

SYSTEMS AND METHODS FOR SPIN PROCESS VIDEO ANALYSIS DURING SUBSTRATE PROCESSING

This application claims priority to U.S. Provisional Patent Application No. 62/930,087, entitled, "Systems and Methods for Spin Process Video Analysis During Substrate Processing," filed Nov. 4, 2019; the disclosure of which is expressly incorporated herein, in its entirety, by reference. This application also claims priority to U.S. Provisional Patent Application No. 62/935,162, entitled, "Systems and Methods for Automated Video Analysis Detection Techniques for Substrate Process," filed Nov. 14, 2019; the disclosure of which is expressly incorporated herein, in its entirety, by reference. This application also claims priority to U.S. Provisional Patent Application No. 62/957,481, entitled, "Hardware Improvements and Methods for the Analysis of Spinning Reflective Substrates," filed Jan. 6, 2020; the disclosure of which is expressly incorporated herein, in its entirety, by reference.

BACKGROUND

The present disclosure relates to the processing of substrates. In particular, it provides a novel system and method for monitoring one or more characteristics of a substrate processing step. In one embodiment, the system and method disclosed herein may be utilized when processing semiconductor substrates.

Traditional substrate processing systems utilize photolithography processes, which include photoresist coating, exposure, photoresist develop, and various bake steps. The materials and processes utilized in these steps may all impact film thickness, critical dimension targeting, line roughness, uniformity, etc. on a substrate. As geometries in substrate processing continue to shrink, the technical challenges to forming structures on substrates increase.

In conventional substrate processing systems, a wafer inspection system (WIS) is often used to inspect a substrate (e.g., a semiconductor wafer) before or after one or more processing steps are performed. For example, a conventional WIS may determine a film thickness (FT) of a layer or film applied to a surface of a wafer after the wafer is subject to a Post Apply Bake (PAB) procedure to cure or harden the layer or film. In another example, a conventional WIS may determine a critical dimension (CD) of a structure formed on the wafer after the wafer is developed to form the structure. Such data may be provided to an advanced process control (APC) system. APC systems may use statistical and/or analytical techniques to process the FT or CD value(s) received from a wafer inspection system and determine how to manipulate process control parameters and/or inputs on process tools to improve output quality. For example, an APC may use an average FT value determined from a WIS to control the speed of a spin chuck disposed within a liquid processing system (e.g., a coating unit or developing unit) of a substrate processing system. In another example, an APC may use an average CD value determined from a WIS to control the temperature in a baking unit (e.g., a Post Exposure Bake (PEB) unit) of a substrate processing system. In addition, most wafer inspection systems are currently provided as a separate module within, or coupled to, the substrate processing system. This adds complexity to the substrate processing system and forces the APC system to be a feedback system.

Gross processing equipment excursions or faults such as equipment breakdowns, material drips, improper arm movements, etc. are also known to be monitored. One approach for monitoring gross processing issues in coating modules has been the inclusion of a camera in a coating module of a processing system. For example, coating modules have included spin module monitor (SMM) cameras which can be used to identify drips of the material being coated, improper dispense arm movements, etc. Images from the SMM camera may be analyzed after processing to determine if a substrate was subjected to such process excursions or faults.

SUMMARY

Various embodiments of systems and methods for monitoring one or more characteristics of a substrate are disclosed herein. More specifically, the present disclosure provides various embodiments of utilizing camera images to provide information regarding characteristics of in a fluid dispense system.

In one embodiment, the location of the substrate within the fluid dispense system may be determined through the use of a camera in the fluid dispense system. More specifically, one or more edges of the substrate may be located. In one embodiment, the edge information may be combined with other information to determine if the substrate is properly placed within the fluid dispense system. For example, data regarding the substrate centering within the system may be obtained by determining the relationship between substrate edges and fixed objects within the system. In one embodiment, substrate centering information may be extracted through a comparison of the substrate edges to a cup of the fluid dispense system.

In another embodiment, characteristics of a puddle formed within the fluid dispense system may be obtained through analysis of the camera image. In one embodiment, edges of a liquid puddle formed on the substrate may be determined from the camera image. The puddle edge information may be utilized in a variety of analysis techniques. In one technique, the percentage of puddle coverage of the substrate may be obtained. In one embodiment, the percentage of coverage of a reducing resist consumption (RRC) solvent may be obtained. In another technique, the puddle edges may be analyzed to identify non-idealities in the puddle shape.

In another embodiment, the camera image may be utilized to analyze the location of a cup within the fluid dispense system. Because the camera is fixed within the fluid dispense system, variations in the location of the cup may be obtained from the camera image. Identification of the location of the cup may be performed to detect deviations in the cup location. Such deviations may occur, for example, after a cup is replaced.

In one embodiment of the use of a camera within a fluid dispense system, the camera is utilized to monitor intensity of light reflected from a substrate during a spin coating step. The reflected intensity as a function of time as a substrate is spin coated may be used to monitor and characterize a spin coating process. The reflected intensity as a function of time may be compared to other substrates to identify substrate to substrate film thickness variations. In one embodiment, the analysis is based upon peaks and/or troughs of the reflected intensity as a function of time.

In another embodiment of the use of a camera within a fluid dispense system, reflected light intensity is obtained as a function of time as a substrate is spin coated and signal processing techniques are performed to account for movement within the system. In one embodiment, the signal processing helps minimize the effects on light reflections caused by the movement of the pattern on the substrate that underlies the spin coated material. The signal processing techniques utilized may include data smoothing, analyzing only certain wavelengths of reflected energy, transforming the data (in one embodiment utilizing a Fourier transform), and/or analyzing a sub-set of the collected pixels of data.

The camera image data collected herein may be combined with a wide variety of other data so as to better monitor, characterize and/or control a substrate processing process flow. In one example, the camera image data may be combined with data collected from a WIS. In another embodiment, the camera image data may be combined with other data collected from the fluid dispense system. Still further, the image data may be combined with other data such as data related to the source of the liquid being dispensed (which liquid source bottle, the liquid source bottle age, etc.).

According to one embodiment, a method of monitoring one or more characteristics of a fluid dispense system is provided. The method comprises providing a substrate within the fluid dispense system and obtaining a camera image of the substrate within the fluid dispense system. The method further comprises determining a location of at least one edge of the substrate from the camera image. The method also comprises utilizing information regarding the location of at least one edge of the substrate to analyze a placement of the substrate within the fluid dispense system.

In another embodiment, a method of monitoring one or more characteristics of a fluid dispense system is provided. The method comprises providing a substrate within the fluid dispense system and forming a liquid puddle on the substrate. The method further comprises obtaining a camera image of the puddle formed on the substrate. The method also comprises identifying edges of the puddle from the camera image of the puddle.

In another embodiment, a method of monitoring one or more characteristics of a fluid dispense system is provided. The method comprises providing a cup within the fluid dispense system and obtaining a camera image of the cup within the fluid dispense system. The method further comprises determining a location of at least one edge of the cup from the camera image. The method also comprises utilizing information regarding the location of at least one edge of the cup to analyze a placement of the cup within the fluid dispense system.

In another embodiment, a method of monitoring one or more characteristics of a fluid dispense system is provided. The method comprises providing a substrate within the fluid dispense system and spin coating a material upon the substrate. The method further comprises utilizing a camera to obtain image data of the substrate over time while the material is being spin coated on the substrate. The method also comprises obtaining reflected intensity data over time from the image data. The method also comprises utilizing the reflected intensity data over time to monitor and/or characterize the spin coating of the material upon the substrate.

In another embodiment, a method of monitoring one or more characteristics of a fluid dispense system is provided. The method comprises providing a substrate within the fluid dispense system and spin coating a material upon the substrate. The method further comprises utilizing a camera to obtain image data of the substrate over time while the material is being spin coated on the substrate. The method also comprises obtaining reflected intensity data over time from the image data. The method also comprises utilizing signal processing techniques on the reflected intensity data to account for movement within the fluid dispense system.

In another embodiment, a method of monitoring, characterizing or controlling a substrate process flow is provided. The method comprises providing a substrate within a fluid dispense system. The method also comprises obtaining a camera image of the substrate within the fluid dispense system, the camera image being a still image or a video image. The method further comprises collecting image data from the camera image. The method also comprises combining the image data with other data related to the substrate process flow so as to monitor, characterize or control the substrate process flow.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

The techniques described herein may be utilized within a wide variety of fluid dispense systems. For example, an exemplary fluid dispense system may be utilized for various fluid dispense purposes (such as, for example, a resist coating unit, a resist developing unit, or other spin coating units) within which fluid are applied to a substrate for processing purposes. It is recognized that the fluid dispense systems shown herein are merely exemplary embodiments of a processing system within which the monitoring techniques described herein may be applied. Thus, the techniques disclosed herein may be applied to other fluid dispense systems and/or other processing units. Moreover, these fluid dispense systems may be stand-alone units or more be integrated in a larger systems. For example, the fluid dispense systems described herein may be integrated within larger systems that include coating, developing, baking, inspection, exposure, etc. modules.

Figure 1:
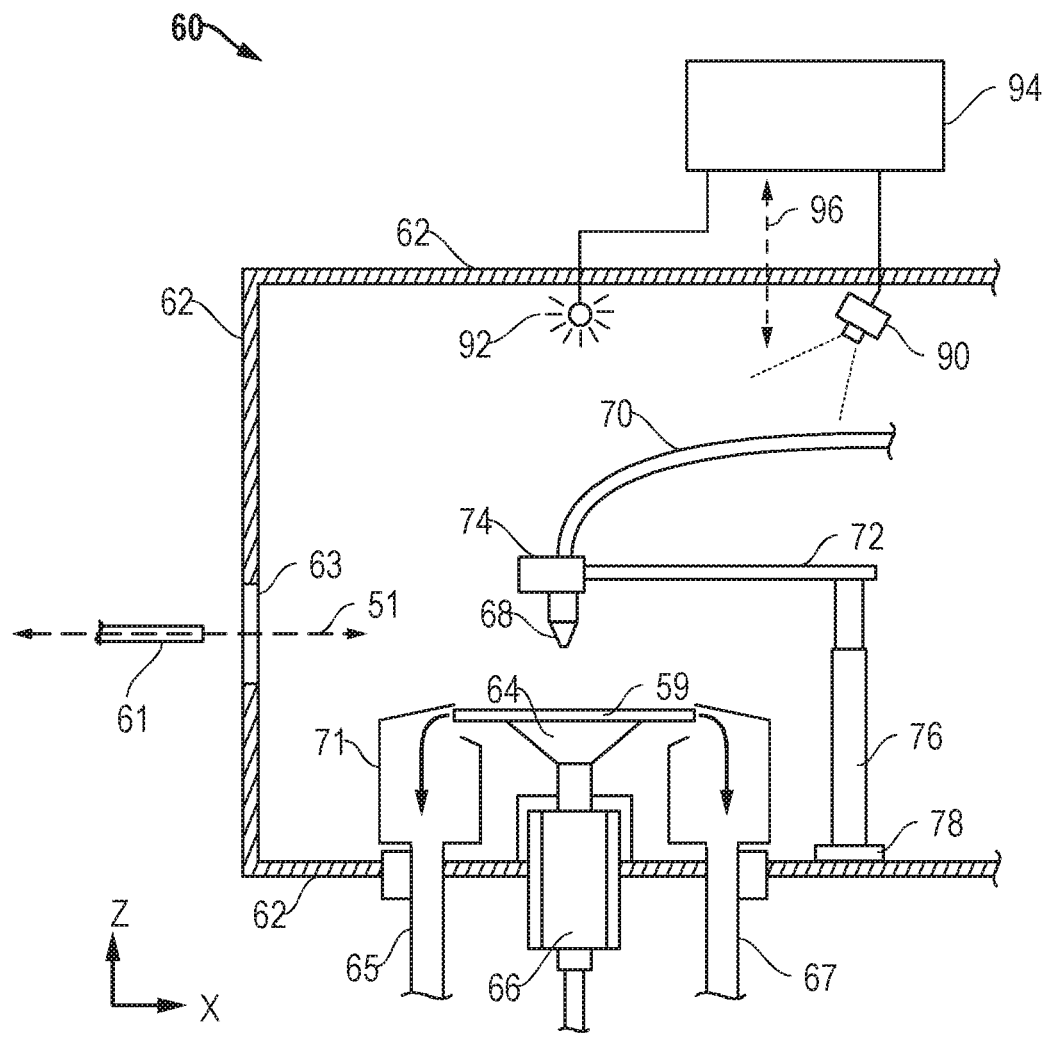
FIG. 1 is an exemplary fluid dispense system.

The fluid dispense systems described herein may be utilized to subject substrates to a wide variety of processing liquids, which may be part of, for example, resist coating unit, a developing unit or other fluid dispense systems (such as for example—spin-on hard mask units, spin-on anti-reflective coating units, etc.). As shown in FIG. 1, a fluid dispense system 60 includes a processing chamber, which is bounded by a chamber walls 62. A spin chuck 64 disposed inside chamber walls 62 provides support for a substrate, which may in some embodiments, be a semiconductor wafer (W). More specifically, the spin chuck 64 has a horizontal upper surface on which the substrate is supported during processing. A suction port (not shown) may be provided in the horizontal upper surface of spin chuck 64 for securing the substrate to the spin chuck with suction. The spin chuck 64, and the substrate supported by the spin chuck 64, may be rotated at a variable angular velocity by a drive mechanism 66, which may be a stepper motor, etc. The drive mechanism 66 may operate at various angular velocities for the application of the liquid material and flow of the liquid material onto the substrate.

A nozzle 68 is adapted to dispense one or more liquid solutions onto the substrate at a specified rate to apply one or more layers or films onto an upper surface of the substrate. Typical layers or films that may be applied to the substrate surface include, but are not limited to, imaging layers (e.g., photoresist), develop solutions, topcoat (TC) barrier layers, topcoat antireflective (TARC) layers, bottom antireflective (BARC) layers, sacrificial and barrier layers (hard mask) for etch stopping, etc. The nozzle 68 is coupled to a liquid supply unit (not shown) through a liquid supply line 70. In some embodiments, nozzle 68 may be attached to the leading end of a nozzle scan arm 72 through a nozzle holder 74. The nozzle scan arm 72 is mounted at the upper end portion of a vertical support member 76 that is horizontally movable on a guide rail 78 in one direction (e.g., in the Y-direction). Although not shown in FIG. 5A, a drive mechanism (not shown) may be coupled to the nozzle scan arm 72, the vertical support member 76 or the guide rail 78 to move the nozzle 68 in the Y-direction. Other mechanisms (also not shown) can be used to move the nozzle 68 in the Z-direction and/or in the X-direction. It will be recognized that the particular dispense and arm mechanisms and movements described herein are merely exemplary as a wide variety of dispense techniques are well known in the art.

A cup 71 is provided to capture and collect a majority of the liquid material ejected from the substrate by centrifugal forces generated during rotation by the spin chuck 64. The spin chuck 64 supports and rotates (i.e., spins) the substrate about its central normal axis relative to the cup 71, which is stationary. Liquid material ejected from the substrate 59 and collected by the cup 71 is drained via a drain line 65 and drain unit (not shown). In some embodiments, an exhaust line 67 and exhaust unit (no shown), such as a vacuum pump or other negative pressure-generating device, may also be used to removes gaseous species (including but not limited to vapors released from substrate layers during processing) from the processing space inside the cup 71.

Spin chuck 64 and drive mechanism 66 are disposed within an opening in the cup 71. In some embodiments, an elevation mechanism, such as an air cylinder and an up-and-down guide unit, may be provided within drive mechanism 66 so the spin chuck 64 may move vertically relative to the chamber walls 62. The substrate can be delivered to the spin chuck 64 by a processing arm 61 through a loading/unloading opening 63 of fluid dispense system 60 in a direction 51 as shown in FIG. 1. The processing arm 61 may form a part of the fluid dispense system 60 or may be part of a separate substrate transfer mechanism (not shown) for interacting with other process equipment. In some embodiments, the processing arm 61 may be included within the main arm mechanism of a larger system for transferring substrates to between various process modules of the larger system. In other embodiments, the processing arm 61 may be included within other substrate processing systems. In some embodiments, the elevation mechanism can lift the drive mechanism 66 and/or the spin chuck 64 upwards to receive a substrate. Alternatively, the cup 71 may be configured to move up-and-down, or may be configured to separate and widen, to allow a substrate to be placed on the spin chuck 64.

It is noted that the fluid dispense system 60 shown in FIG. 1 is merely one example processing system in which the monitoring techniques described herein may be used. Thus, the fluid dispense system 60 is not meant to be limiting, but rather merely representative of one example processing system within which the monitoring techniques described herein may be utilized. Further, though the fluid dispense system 60 is described with reference to a system for processing substrates, which may in some embodiments be semiconductor wafers, it will be recognized that the techniques described herein may be utilized when processing other types of substrates. Thus, it will be recognized that the monitoring techniques described herein may be utilized within a wide range of substrate processing systems that apply liquid solutions to substrates.

Figure 2:
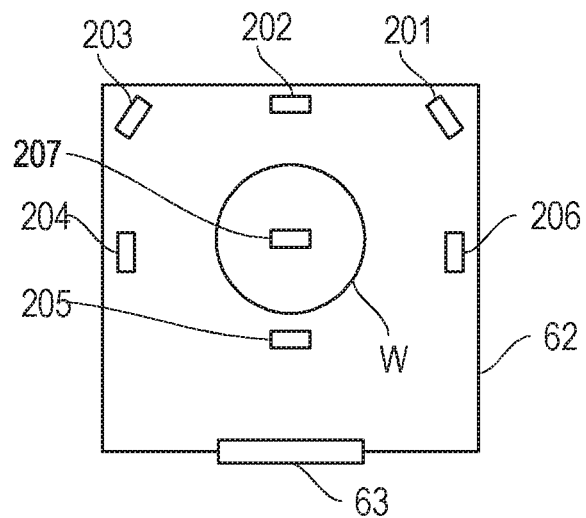
FIG. 2 illustrates exemplary camera locations for the fluid dispense system of FIG. 1.
Figure 3A:
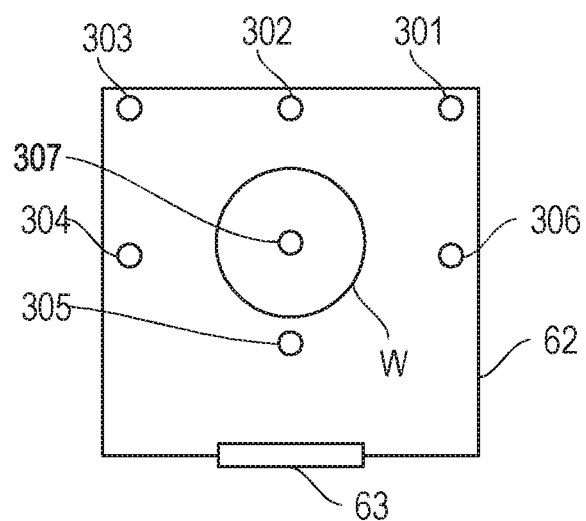
FIG. 3A illustrates exemplary light locations for the fluid dispense system of FIG. 1.

The fluid dispense system 60 also includes a light source 92 and a camera 90 as shown in FIG. 1. As used herein, "camera" may refer to simply a camera or may be a more complex system that includes a camera and other electronics. The camera 90 may be utilized to monitor the fluid dispense and coating process as described in more detail herein below. The locations of the light source 92 and camera 90 shown in FIG. 1 are merely exemplary and a wide variety of other positions may equally be utilized to allow the camera 90 to monitor the condition of the substrate surface. FIGS. 2 and 3 provide a simplified top view (excluding many of the details of FIG. 1) of the fluid dispense system 60 so as to better illustrate exemplary locations of the camera 90 and light source 92. It will be recognized, however, that these locations are merely exemplary and other locations may be utilized. As shown in FIGS. 2 and 3 the substrate 59 is provided within the chamber walls 62 of the processing chamber which has a loading/unloading opening 63. FIG. 2 illustrates exemplary locations for locating the camera 90 in the upper regions of the process chamber above the substrate. More specifically, FIG. 2 illustrates exemplary camera locations 201, 202, 203, 204, 205, 206, and 207 for locating the camera 90. FIG. 3A illustrates exemplary locations for locating the light source

92 in the upper regions of the process chamber above the substrate. More specifically, FIG. 3A illustrates exemplary light source locations 301, 302, 303, 304, 305, 306 and 307 for locating the light source 92. Again it will be recognized that such locations of the camera and light source are merely exemplary and other locations may be utilized.

The analysis of a fluid dispense process with a camera may include a wide range of techniques of analyzing and processing the images obtained of the fluid dispense process. Such techniques may include analyzing still images and/or analyzing video images obtained from the camera. The monitoring of fluid dispense processes and the image obtained may be utilized for real time analysis/control and/or post process analysis. This image analysis may provide hardware and process feedback that may otherwise not be available and can lead to improvements and optimization. Image recording is an efficient method of data collection that can be done for every substrate. The image analysis can be used to determine and/or control a variety of variables including film thicknesses, critical dimensions, film uniformity, etc. In order to efficiently and accurately analyze images collected, automated techniques may be desirable.

The hardware utilized to monitor a spin coating process may be optimized in a wider variety of manners so as to provide more accurate information regarding the film formed on a substrate. More specifically, as described below, a wide variety of hardware related techniques may be utilized, either in combination or singularly, to improve the collection of data using the camera system. These hardware techniques may include improvements to the light source 92, improvements to the sensors of the camera 90, the relationship of the physical orientation of the light source 92 to the camera 90, the selection of certain pixels of the image for analysis, and the relationship of the camera frame rate with the rotational speed of the substrate.

Optimization of the hardware may address a variety of issues that arise when using an optical sensor during a spin coating process. In a spin coating process, it is possible to visually observe color changes on the wafer as the coated film decreases to its final coat thickness. These color changes are due to thin film interference reflectivity effects. For example when coating a resist layer on a substrate, these thin film interference reflectivity effects are the effects of the resist/air reflected light wave with the resist/substrate reflected light wave. As interference of different wavelengths happen at different film thicknesses, one may use the changing of the wavelength (and thus the color) that is having interference effect to monitor film thickness changes.

Figure 3B:
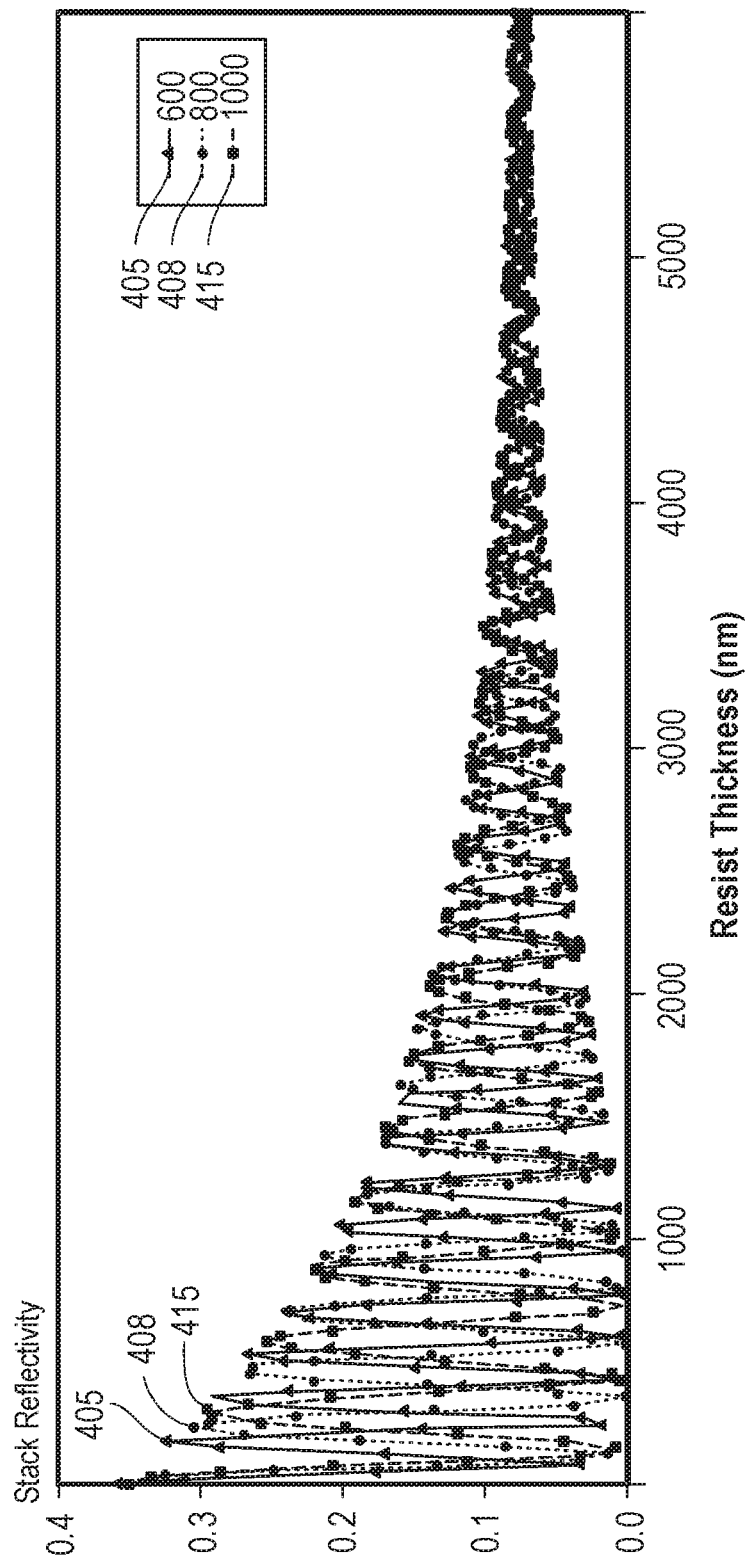
FIG. 3B illustrates a plot of reflectivity versus resist thickness for wavelength assumptions.

For example, FIG. 3B illustrates the impact on reflectivity as a film thins during spinning. Note, in FIG. 3B the x axis represents resist thickness and the y axis illustrates the stack reflectivity. As shown in FIG. 3B, reflectivity changes for three different exemplary processes having three different wavelength assumptions are illustrated. More specifically, plot 405, plot 408 and plot 415 illustrate different center wavelengths assumptions for a Gaussian distribution light source assumption in simulation. In simulation, the reflectivity at a given film thickness assumption is determined.

Depending upon the film thicknesses involved and the underlying substrate conditions and materials, however, detection, discernment, analysis, and correlation of the reflected signal may be difficult. For example, for a typical resist/substrate refractive index relationship, an optical path length thru the resist film that is a half multiple of the wavelength of the light divided by the refractive index of the material will have constructive interference with the same wavelength of light that is reflected off of the air/material surface and will have destructive interference with that same light if the optical path length is a quarter multiple of the wavelength of light divided by the refractive index of the material. As material decrease thickness, the wavelength(s) of light that will constructively interfere change and thus results in an oscillation of the visible spectrum color (or intensity) seen by an observing camera (or sensor). For some LED light sources, that can have a significant spectral range, it means however that there are situations in which a least common multiple thickness relationship happens between two distantly different wavelengths having constructive interference simultaneously which mixes the color response seen by the camera and leads to loss of signal.

Figure 3C:
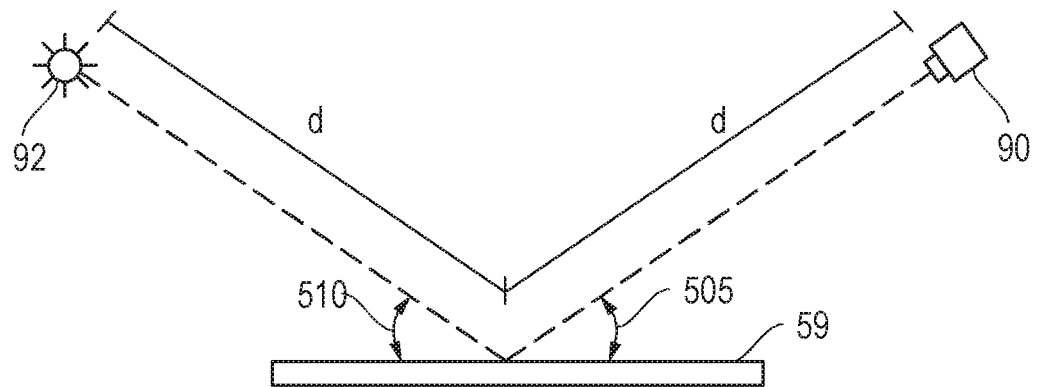
FIG. 3C illustrates a physical placement relationship of a light source, camera and substrate.
Figure 3D:
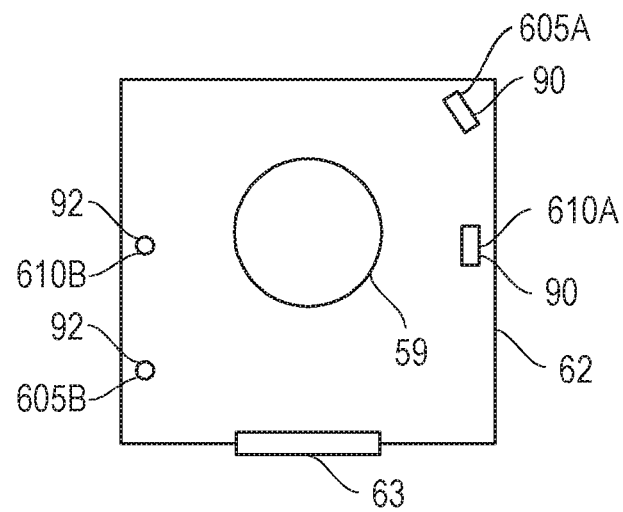
FIG. 3D illustrates alternative placements of a camera and light source.

The physical location of the light source and camera are optimized together. More specifically, as a reflectivity signal is being collected, the reflectivity signal strength may be maximized by ensuring the 0th order reflection of the light source off the substrate is being collected into the optical sensor (for example a camera). Doing this also mitigates other effects, which are experienced in other sensor/light source orientation relationships such as light diffraction effects from underlying highly reflective gratings. To ensure and maximize the reflectivity signal, the physical locations of the light source and camera may be adjusted. Specifically, it may be desirable to 1) maintain a similar angle to a reference plane (that is parallel to the substrate plane) of the light source and the optical sensor, 2) maintain a similar distance relationship of the light source to the center of substrate and the center of substrate to optical sensor and 3) to have the optical sensor positioned 180 degrees diagonally across from light source. Exemplary locations illustrating these concepts are shown in FIGS. 3C and 3D. As shown in FIG. 3C, a light source 92 and camera 90 are placed with reference to a substrate 59. The locations of the light source 92 and camera 90 may be chosen so that the angle of incidence 505 and angle of incidence 510 of the figure are similar. In one embodiment, the angles of incidence are within 20 degrees of each other, in a more preferred embodiment within 10 degrees, and in an even more preferred embodiment are approximately the same. Further, the distance from the light source 92 to the center of the substrate 59 may be d, and the distance from the camera 90 to the center of the substrate 59 may be the same distance d as shown in FIG. 3C. In one embodiment, the distances may be within 10% of each other and in another embodiment 5% and in a more preferred embodiment substantially the same.

Further, as shown in FIG. 3D it may be desirable to have the light source 92 and camera 90 located across from each other. In one embodiment, the light source 92 and camera 90 are substantially 180 degrees diagonal from each other, and in another embodiment located within 10 degrees of being 180 degrees diagonal from each other and in another embodiment within 20 degrees of being 180 degrees diagonal from each other. It is noted that the closer to being 180 degrees diagonal generally provides improved results. FIG. 3D illustrates two exemplary pairings of locations providing for such diagonal relationship. For example, the camera 90 may be placed at location 605A and the light source 92 may be placed at location 605B. This pairing of locations provides the desired 180 degree relationship. Likewise, alternative locations 610A and 610B may be chosen for the light source 92 and camera 90.

It will be recognized that the arrangements of FIGS. 3C and 3D are merely exemplary locations to provide the angle and distance benefits described above and other locations may be chosen to achieve the same angle and distance results.

A one embodiment, a specific selection of the pixels from which data is collected in a frame of the substrate is performed. For example, all pixels that represent the substrate may be used for the benefit of pixel averaging out any small differences in pixel absorption properties of the camera as well as sources of image noise (vibration, moving arms, slight changes of light source intensity, outside coat cup light environment, etc.). However, inclusion of sources of image noise might not be desirable. Also, use of all pixels would include pixels that represent non $0^{th}$ order reflections. However, use of only a subset of pixels may address these issues and provide more accurate data. For example, if the light source/light spectral range is not well aligned with camera absorption properties (e.g. the spectral tail of light source is the only thing that is being absorbed by camera) then averaging all of the pixels from a substrate leads to a loss of signal. One way to address this issue and to regain the signal is to limit the pixels selected to only those pixels in and/or in close proximity to the observable primary reflection of the light source in the camera frame. Such pixels in and/or in close proximity to the observable primary reflection of the light source in the camera frame represent the pixels that are most representing the $0^{th}$ order reflection of our light source. Similarly, selecting only a subset of pixels may allow for the exclusion of regional based noise sources. Thus, use of a selected subset of pixels may provide an improved signal from which data regarding the conditions on the substrate may be extracted. The size of area that the subset of pixels may be limited to may be highly dependent upon the light source and camera combination utilized.

Figure 3E:
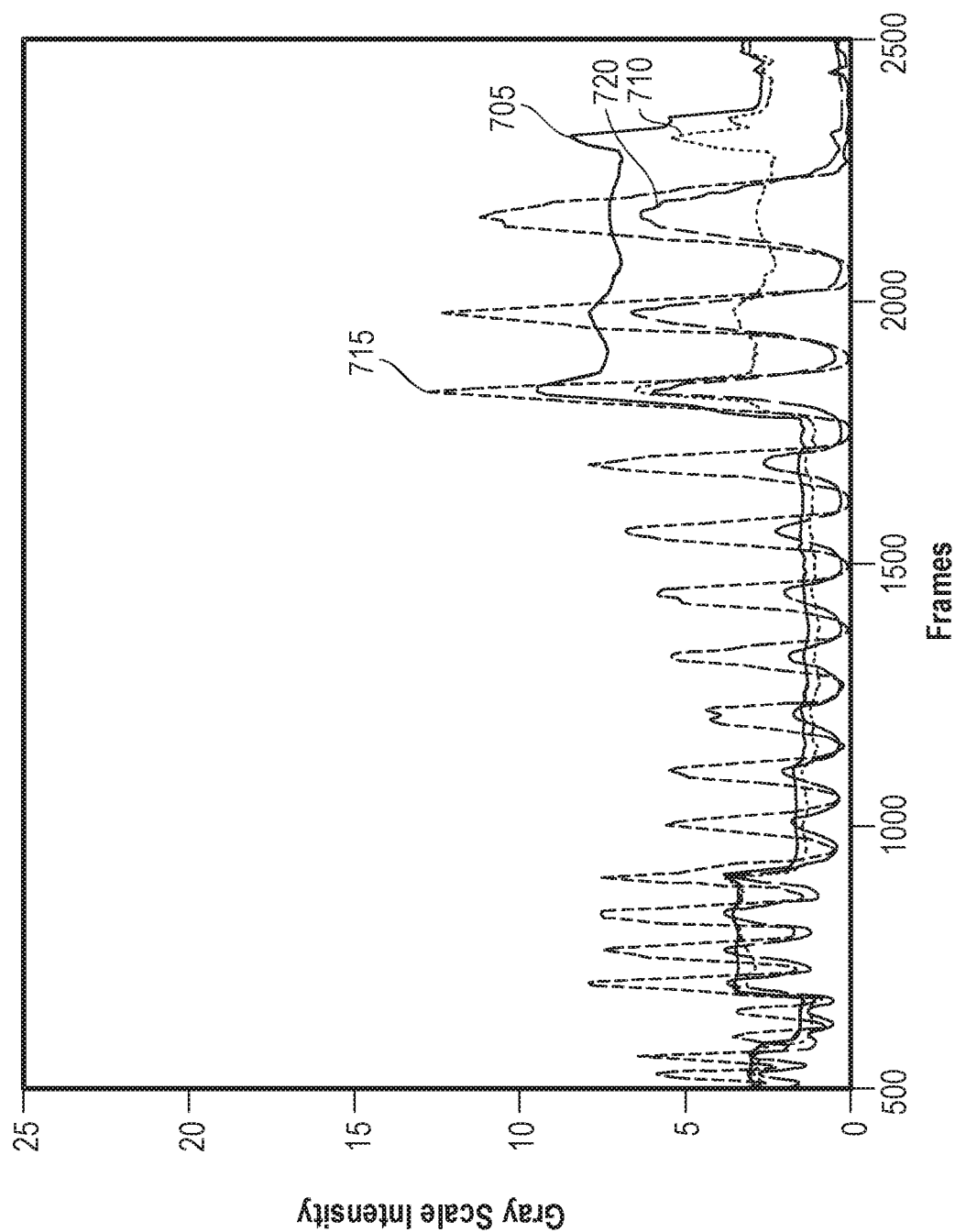
FIG. 3E illustrates plots of a reflectivity intensity versus frames for differing selections of pixels.

FIG. 3E illustrates exemplary effects of selecting only a subset of pixels for analysis. As shown in FIG. 3E, plots of the average gray scale intensity (after removing the average frame from shortly after dispense start to end of processing) for a series of frames that are obtained over time from the camera data (thus, the x-axis being collected over time). Plot 705 represents the intensity obtained over the entire collected image from the camera. Plot 710 represents the intensity obtained when the data is limited to a region that corresponds to the substrate. It can be seen that for both of these plots, noise sources and the wide range of the reflections provide large areas of noise where the signal loses its cyclical nature over many frames. Plot 715 and Plot 720 are plots in which only a subset of pixels of the substrate are analyzed. The size of area from which the subset of pixels may be limited to may be highly dependent upon the light source and camera combination utilized. For example, when using an IR LED light source at 850 nm and a first camera with an integrated IR filter, extreme pixel masking to narrowly select the location of reflection on the light source may be desirable, for example limiting the pixels to 10% or even 5% or less of the pixels that correspond to the substrate area. However, in another embodiment utilizing different camera (CMOS camera) without an IR band pass filter and an IR LED source at 850 nm, pixel masking may not be to the same level as the prior example to provide a determination of the reflected signal (though masking may still increase the amplitude of the detected signal). For example, pixel masking of only approximately half the pixels that correspond to the substrate area may be utilized. As seen from the plots, the use of a subset of pixels provides a signal with better noise characteristics.

The techniques described herein are not limited to a particular camera and light source type. The camera may be any of wide variety of types of cameras designed to capture and/or store data from an image. The cameras may collect still images and/or video images. A wide variety of cameras may be utilized, including but not limited to, charged coupled device (CCD) image sensor cameras, complementary metal oxide semiconductor (CMOS) image sensor cameras, N-type metal-oxide-semiconductor (NMOS) image sensor cameras, indium gallium arsenide (InGaAs) image sensor cameras, indium antimony (InSb) image sensor cameras, etc. The light source may typically be a light source of the visible spectrum or longer. For example, light sources in the visible spectrum, near-infrared (NIR), shortwave-infrared (SWIR) and mid-infrared (MIR) are exemplary light sources. In one embodiment, an amber light source in the visible spectrum may be utilized. In another embodiment, an infrared (IR) light source is utilized. In yet other embodiments, a multi-spectrum light source may be utilized. It will be recognized that many cameras may include integrated filters that block the IR spectrum. The use of such filters may be undesirable if the IR spectrum is desired for analysis.

As mentioned above, monitoring of a wide range of variables and conditions of the fluid dispense process may be achieved through the utilization of a camera in the fluid dispense system. Various monitoring techniques are described below. It will be recognized that these techniques need not be utilized together but rather may be utilized individually. Alternatively, some or all of the techniques may be combined for more thorough monitoring.

Substrate Edge Detection, Puddle Monitoring and Cup Monitoring

The use of a camera within a fluid dispense system may include uses related to substrate edge detection, puddle monitoring and cup monitoring.

In one embodiment, the location of the substrate within the fluid dispense system may be determined through the use of a camera in the fluid dispense system. More specifically, one or more edges of the substrate may be located. In one embodiment, the edge information may be combined with other information to determine if the substrate is properly placed within the fluid dispense system. For example, data regarding the substrate centering within the system may be obtained by determining the relationship between substrate edges and fixed objects within the system. In one embodiment, substrate centering information may be extracted through a comparison of the substrate edges to a cup of the fluid dispense system.

In another embodiment, characteristics of a puddle formed within the fluid dispense system may be obtained through analysis of the camera image. In one embodiment, edges of a liquid puddle formed on the substrate may be determined from the camera image. The puddle edge information may be utilized in a variety of analysis techniques. In one technique, the percentage of puddle coverage of the substrate may be obtained. In one embodiment, the percentage of coverage of a reducing resist consumption (RRC) solvent may be obtained. In another technique, the puddle edges may be analyzed to identify non-idealities in the puddle shape.

In another embodiment, the camera image may be utilized to analyze the location of a cup within the fluid dispense system. Because the camera is fixed within the fluid dispense system, variations in the location of the cup may be obtained from the camera image. Identification of the location of the cup may be performed to detect deviations in the cup location. Such deviations may occur, for example, after cup replacement.

In a first embodiment of the substrate edge detection, puddle monitoring and cup monitoring techniques, monitoring via the camera may be utilized to determine the edge of the substrate. One use of such monitoring is to determine the centering of the substrate. For example, because the camera and other elements of the fluid dispense system 60 (such as the cup 71) may be fixed objects, the relationship of the substrate to the other elements (for example the cup edge) may be used to extract centering information indicative of proper placement of the substrate within the fluid dispense system 60.

For example, if the substrate may be delivered by the processing arm 61 above the spin chuck 64. A pin system within the spin chuck 64 may rise up to receive the substrate lower the substrate on the spin chuck 64. In the process of lowering the substrate to the spin chuck 64, the camera may be utilized to determine the relationship of the substrate 59 to a fixed point of the fluid dispense system 60, such as the front edge of the cup 71 and also the relationship of the substrate to the back edge of the cup 71 to get information of substrate centering as each substrate is delivered in real-time. Upon detection of deviations of this relationship, the system can issue an alert regarding a potential substrate placement error and/or feedback of the placement error may be provided to the processing arm 61 to actuate a correction.

Figure 4A:
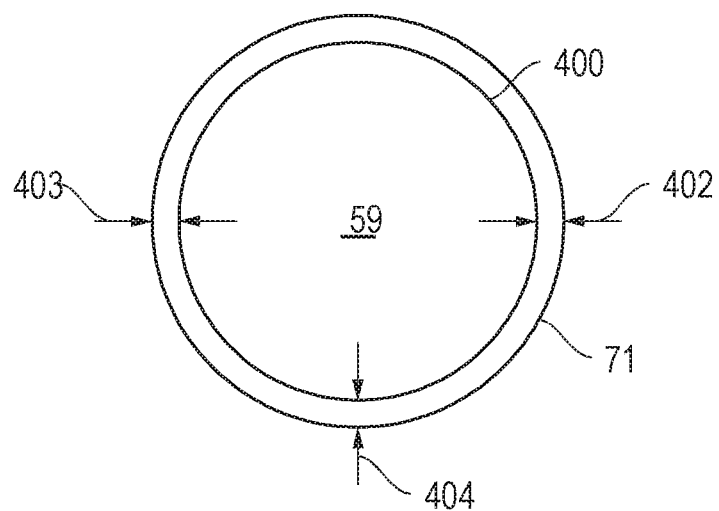
FIGS. 4A and 4B illustrate the relationship between a substrate edge and a cup edge.
Figure 4B:
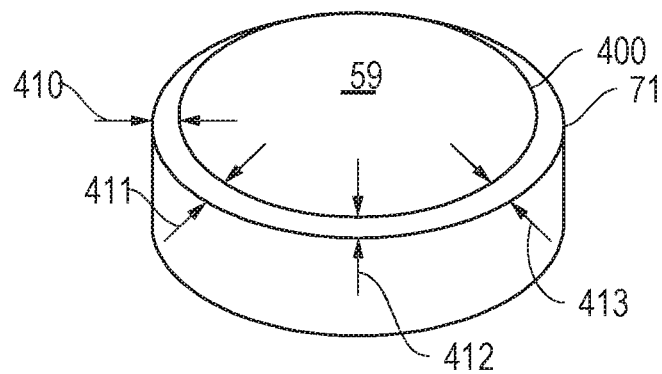

FIGS. 4A and 4B illustrate the relationship that may be detected between edges 400 of substrate 59 and the cup 71. For example, FIG. 4A illustrates an example image from a system having a camera placed directly above the substrate 59. As shown in FIG. 4A, by detecting the edges 400 of the substrate 59 utilizing the camera, the location of the substrate 59 may be determined relative to the cup 71. More particularly, one or more distances between the edges 400 and the cup 71 may be detected, such as for example distances 402, 403, and 404 shown in the picture. Detection of the relative locations of the edge and the cup 71 may be used to determine the centering of the substrate. FIG. 4B illustrates an example image that may be obtained from a system having a camera above, but to the side of, the substrate 59. Again, the image may be utilized to detect the relative location of the edges 400 of the substrate 59 with regard to the cup 71 as shown by one or more example distances 410, 411, 412, and 413. Thus, once again centering information of the substrate may be obtained.

In a second embodiment of the substrate edge detection, puddle monitoring and cup monitoring techniques, information regarding a liquid puddle formed on the substrate may be detected. More particularly, a common technique utilized in spin coating processes is to form a puddle on the substrate of a liquid material (typically prior to spinning or at the beginning of a low speed spin). In one embodiment, the liquid material that is dispensed to form a puddle may be the coating material (for example photoresist). In another embodiment, the material which is formed via a puddle may be a solvent pre-wet material applied to the substrate prior to the coating material so as to change the surface energy of the substrate to be coated. In one example the pre-wet material may be used for the purpose of providing easier wettability for lower material consumption of the coating material. One well-known example of such pre-wet material is a reducing resist consumption (RRC) solvent.

By utilizing the camera video monitoring, useful information about the surface energetic state of the incoming substrate may be obtained. For example, by detecting the edges of the substrate with the camera 90 and the extent of the puddle flow of the puddled material (for example a RRC solvent puddle), the percent substrate coverage by material may be detected. For example, the number of pixels covered by an RRC solvent puddle may be compared to the total number of pixels associated with the substrate and a percent coverage may be calculated before a RRC solvent spin cast step begins. By comparison of the percent substrate coverage to previous results for percent substrate coverage from same substrate processing step for other substrates (or comparison to a desired baseline result), detection of substrate surface condition changes can be identified. Alternatively, data on the dynamic measurement of the coverage state during RRC puddle formation may be collected over time and again compared to prior results or expected baseline results. Use of comparisons to analyze the percent of wafer coverage of the puddle may thus be utilized to determine if a substrate surface condition is similar to an expected result or different from what is expected. Such information may be collected and used to characterize, control, evaluate, and/or monitor the processing in a substrate process flow.

In a third embodiment of the substrate edge detection, puddle monitoring and cup monitoring techniques, analyzing the formed puddle may be used more generally to evaluate the spin coat process and/or the state of the substrate to be coated. Thus, for example, any material within the spin coat process which would be affected by a change the surface energy of the substrate may be analyzed by considering the results of puddle monitoring. Thus, for example, as discussed the puddle analysis may reflect the wettability and associated material consumption. However, more general process fault detection may also be performed by utilizing the camera monitoring to evaluate the puddle formation. Thus, a variety of spin coat materials may be monitored during a puddle process. Such monitoring may be during a static dispense (not rotating during dispense). In other embodiments, the monitoring may be during a lower revolutions per minute (RPM) condition of the dispense step. Collected information as to the extent of the formed puddle provides useful process information about the surface energetic state of the incoming substrate. By using an edge finding algorithm, the percent wafer coverage of the static dispense puddle formed (number of pixels covered by material/total number of pixels associated with the wafer) before the material cast step can then be known. Use of comparisons to previous results (or baseline results) for percent wafer coverage from same substrate process flow may be used to judge if substrate condition is similar or has changed. Alternatively, a dynamic measurement of the coverage state thru dispense and cast (depending on viscosity) may be detected and used for process monitoring and/or to control various variables during processing. Further, the puddle formation percentage coverage as a function of time may also be used for comparisons to previous results from the same substrate process flow to determine if the substrate condition is similar to or has changed from what is expected.

The second and third embodiments of the substrate edge detection, puddle monitoring and cup monitoring techniques discussed above may provide input parameters into advanced process controllers or process control computer systems for potentially providing valuable information for fault detection. For example, a wide range of process faults may be flagged, including for example but not limited to identifying poor adhesion conditions, identifying degradation of adhesion material, identifying incoming substrate condition variations and identifying the extent/quality of surface preparation material (e.g. brush material in directed self-assembly (DSA) lithography applications.

Figure 5:
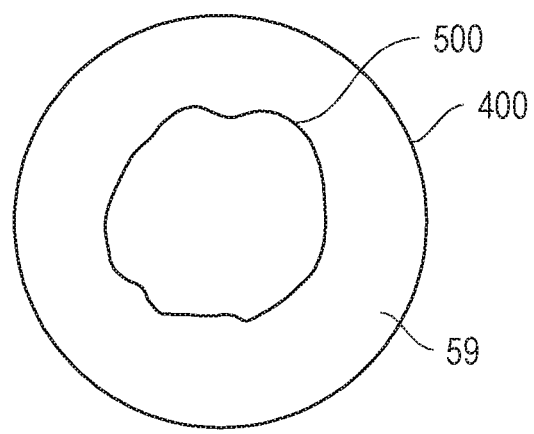
FIG. 5 illustrate a puddle formed upon a substrate.
Figure 6:
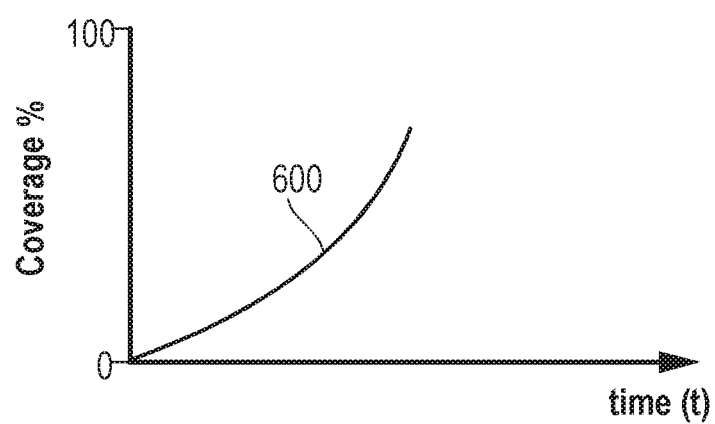
FIG. 6 illustrates the coverage percent versus time for a fluid dispensed on a substrate.

In one analysis embodiment utilizing camera 90, the edge of the fluid as it is detected on the substrate may be detected. In one example, the detected edge may be the original puddle formed by the dispense prior to spinning the substrate. In another embodiment, the edge may represent the puddle as it is spread during spinning. FIG. 5 illustrates an example image of a puddle 500 formed upon a substrate 59 having edges 400. It will be recognized that though FIG. 5 illustrates a center top camera image, the image may be obtained from any of a wide variety of camera placements. It will also be understood that the puddle 500 may be formed of any of a wide variety of materials that are deposited upon a substrate to form a puddle. The image obtained may be analyzed to detect intensity, color and/or greyscale difference or gradient differences in intensity, color or greyscale across the substrate so as to determine the edges of the puddle 500 of material that is deposited on the substrate. The differences may be differences between the exposed substrate areas and areas of the substrate covered by the puddle. This information may be utilized so as to determine the edges of the puddle 500 of material that is deposited on the substrate. The percentage of coverage of the puddle may be calculated from such image analysis. The image analysis may be performed upon one static image (for example after dispense but immediately before spin). Alternatively, the image analysis of the puddle may occur dynamically over a period of time, for example by analyzing a video or multiple still images (including images obtained during spinning of the substrate). Thus, for example, as shown in FIG. 6, the percent of coverage may be plotted against time as shown by curve 600. In one embodiment, the puddle analysis data may be collected from just prior to dispense through the completion of dispense prior to spinning. In another embodiment, the puddle may be analyzed even during spinning of the substrate. For analysis that occurs during spinning, higher resolution cameras may be needed because as the deposited material thins due to spinning, the differences across the substrate will become more subtle and more difficult to detect.

The dispense edge detection provides a method to analyze a dispense recipe and the associated fluid coverage through time. During a process in which fluid is applied to a substrate, the substrate may spin to move the fluid outward to cover the substrate. The spinning of the substrate may occur before, during, or after the dispense of the fluid starts and may change speed at which it spins throughout the recipe. As the substrate spins, the dispense edge detection techniques provide a way to measure how much of the substrate is covered at any point in time. Detection of the dispense edge may also be used to provide feedback to the fluid dispense system and help determine how effective the dispense process is.

The dispense edge detection technique may use a variety of detection and data processing methods, including some that are used to detect the dispense start frame. In one embodiment, first the dispense recipe is identified and the appropriate frames determined to be used for analysis. For example, in order to find the start of the recipe the arm movement into the field of view, the movement downwards toward the substrate, and the end of the downward movement may be detected as discussed above. Once the end of the downward movement is detected, a predetermined set of pixels may be used to search for the initial dispense on the substrate based on the maximum intensity change.

From the start of the dispense on the substrate of the fluid, the initial outline and outer edge of the fluid on the substrate may be found by analyzing the intensity change across the substrate over time. Once the outer edge of the dispense is found, a shape may be fit to track the movement outwards throughout the recipe based on the camera angle (for example a circular puddle of fluid on the substrate will not have a circular image pattern if the camera is located in a corner of the fluid dispense system). Similar to a series of circles with varying radii, multiple iterations of the previously determined shape may be fitted moving outward from the initial dispense to the edge of the wafer. It may then be determined which pixels fall within a given iteration of the shape but not within any of the other iterations. Then for each frame in the recipe after the dispense is detected, the intensity may be calculated for each set of pixels within each shape iteration. In one embodiment, the intensity difference is calculated for each frame and a possible threshold or filters may be used to ignore certain intensity differences. For the set of pixels calculated from the intensity difference, it is then determined which shape iteration each of these pixels fall within. This may then be used to detect the edge of the dispense for the current frame in the recipe. Once the edge is detected for each frame in the recipe, the number of pixels within each puddle detected for each frame may be calculated. In addition, the ratio of the number of pixels within each edge and total number of pixels within the substrate may be calculated. This calculation gives insight into the coverage of the substrate throughout the recipe and the coverage rate of change. It will be recognized that other calculations may also be utilized to characterize the edge of the fluid on the substrate. The analysis may include an analysis of the whole image frame or only an analysis of a subset of pixels of the image frame (for example pixels in which the dispense fluid is expected to be present during the actual dispense of fluid).

One exemplary embodiment of a workflow for tracking the puddle edge may thus be as follows. First, the appropriate frames to analyze from the camera data are determined. This determination may be based upon the hardware movement detection and/or detection of the dispense start as described above. Thus, the analysis may be focused on the relevant frames proximate in time to the formation of the puddle. Second, the outer edge of the initial dispense edge is determined based on the intensity difference for a given set of pixels. Third, a shape is fit to the initial dispense puddle edge based on the camera angle. This shape is then used to track the puddle edge throughout the recipe. Fourth, throughout the recipe, multiple iterations of the shape are fit to the current frame moving outwards from the shape fit for the previous frame to the edge of the substrate. For example if a circle was fit to the initial puddle, multiple circles with each having a slightly larger radius than the previous, would be fit to the current frame. Fifth, the difference is calculated for each frame and the edge is found from the maximum number of points that fall within a given ring or area of the multiple iterations of the shape. In one embodiment, filtering of the data may be applied before the intensity difference analysis so as to limit the amount of data that needs processing. Without filtering, the amount of data present makes fitting the data more difficult. Furthermore, in one embodiment only fitting of the outer most data points of the puddle is performed to further enhance the accuracy and speed of the calculations. In addition, filtering of data points and shapes may further be based on tracking fits for previous frames and the rate of puddle expansion over time.

In a fourth embodiment of the substrate edge detection, puddle monitoring and cup monitoring techniques, the camera 90 may be used for assessment of wettability issues of the develop solution on top of the resist which leads to significant macro defects. For example, develop solution pullback may be detected. In this analysis, camera monitoring may be utilized to detect puddle edges of the develop solution. For example, edge finding algorithms may look for any non-ideality in the develop puddle. Such non-idealities may be, for example but not limited to, random zones of pullback on substrate, puddle fingering at edges as develop puddle expands, etc. Upon determination of non-idealities in the puddle formation, the system may cause an alert. In one embodiment, the alert may be used to indicate a potential substrate placement error. In some embodiments, the alert of potential substrate placement errors may be used to provide feedback of the placement error to a robotic arm for placement correction.

In a fifth embodiment of the substrate edge detection, puddle monitoring and cup monitoring techniques, use is made of the fact that the camera 90 is a fixed object within the video scene within the process chamber bounded by the chamber walls 62. With the understanding that the camera 90 is fixed, the relationship of the cup 71 edge in an X and Y cut plane may be used to extract cup location information. Thus, by taking a cut plane in X (and/or in Y) of the image detected by the camera, the cup location may be identified from intensity, color and/or greyscale difference or gradient differences in intensity, color or greyscale (i.e. identifying where the cup 71 is located within the image frame). Such cup location detection may be performed from a camera image either with or without the substrate present. Preferably, the image may be captured at a point in time in the process sequence when arm movements are not affecting the cut plane signal. The cup location detected can be used for monitoring and the system may look for deviations of cup location. Alerts may then be provided within the system as to when a deviation from expected cup locations are detected. For example, after cup replacement, deviations may be detected that result from either usage of the wrong cup or a cup placement that is off relative to an expected baseline (for example the cup is not properly placed during replacement). In such cases, an alert may be generated. Also, if a cup shifts over time during usage of the system, an alert may be generated.

Coupled to (or even part of) the fluid dispense system 60 as shown of FIG. 1 may be a controller 94 for setting and controller various process operation parameters of the system. The controller 94 may be coupled to the camera 90 and light source 92 as shown. The controller 94 may also be coupled as indicated by signal line 96 to any or all of a number of the components of the fluid dispense system 60 to receive information from and/or to control the components. For example the controller 94 may receive information from and provide control information to the processing arm 61, spin chuck 64, drive mechanism 66, nozzle 68, nozzle scan arm 72, etc. The controller 94 may also be generally configured to analyze various data collected by the fluid dispense system, and in some cases provide feedback control to various process operation parameters. Thus, the techniques for data processing and system control described herein may be implemented by a controller 94. It is noted that the controller(s) 94 described herein can be implemented in a wide variety of manners. In one example, the controller may be a computer. In another example, controller 94 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality described herein for controller 94. It is further noted that the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

In the manner described above, intelligent control of the fluid dispense system may be provided through the use of data collected by a camera placed within the fluid dispense system. The collected data may be used for, but not limited to, flagging deviations in substrate centering, deviations of surface energetics of incoming substrates, and non-idealities/excursions of puddling. The data collected from the camera images is not limited to a particular form. For example, in one embodiment, color data may be collected and detected differences of color may be utilized to identify the various features mentioned above, such as for example, substrate edges, cup edges, puddles, etc. In another embodiment, greyscale information may be obtained and changes across the image utilized to identify the features. Further, just sub-sets of information may be utilized. For example, even though red green blue (RGB) channel color data may be obtained, only one channel may be analyzed for detection of the various features such as substrate edges, cup edges, puddles, etc. For example, the changes in the R channel alone may be utilized to identify substrate edges, cup edges, puddles, etc. Further, it will be recognized that a the data analysis and data processing techniques applied to the image data may be accomplished in a wide variety of manners so as to achieve the results discussed herein, and the techniques described are not limited to a particular approach.

Film Thickness Measurement of Spin Coated Films Using Light Reflection

In one embodiment of the use of a camera within a fluid dispense system, the camera is utilized to monitor the intensity of wavelengths reflected from a substrate during a spin coating step. The reflected intensity as a function of time as a substrate is spin coated may be used to monitor and characterize a spin coating process. The reflected intensity as a function of time may be compared to other substrates to identify substrate to substrate film thickness variations. In one embodiment, the analysis is based upon peaks and/or troughs of the reflected intensity as a function of time.

Thus, the fluid dispense system 60 of FIGS. 1-3 may also be controlled to provide a film thickness monitoring technique during spin coating. An example film spin coating technique involves a polymer dissolved in a solvent. As coating material is dried to evaporate the solvent, a film of high uniformity is left behind. Typically, film thicknesses for spin coated films are measured after coat and/or after a post apply bake (PAB) using a stand-alone spectroscopic tool. The fluid dispense system 60 and techniques disclosed herein allow for real-time monitoring of the film thickness as a film is coated. In addition, such techniques are more conducive to various process control schemes.

As the spin coated material dries, visible color changes may be observed as the resultant film thickness dynamically changes and finally stabilizes. The fluid dispense system 60 and associated camera 90 may be used monitor film thickness uniformity by detecting color changes during the spin coating process. More specifically, video images obtained by camera 90 during the coat process may be used to monitor substrate to substrate film thickness uniformity. Specifically, the reflected light from the substrate changes during the spin coating process due to the coated film drying. This change may be used to determine if the film thickness was consistent to the other substrates (or baseline substrates). Thus, the dynamic color change that a drying film exhibits may be an identifying fingerprint for the final film thickness, and so, process control schemes may be built around this ability to monitor the coated film thickness in real time.

Figure 7:
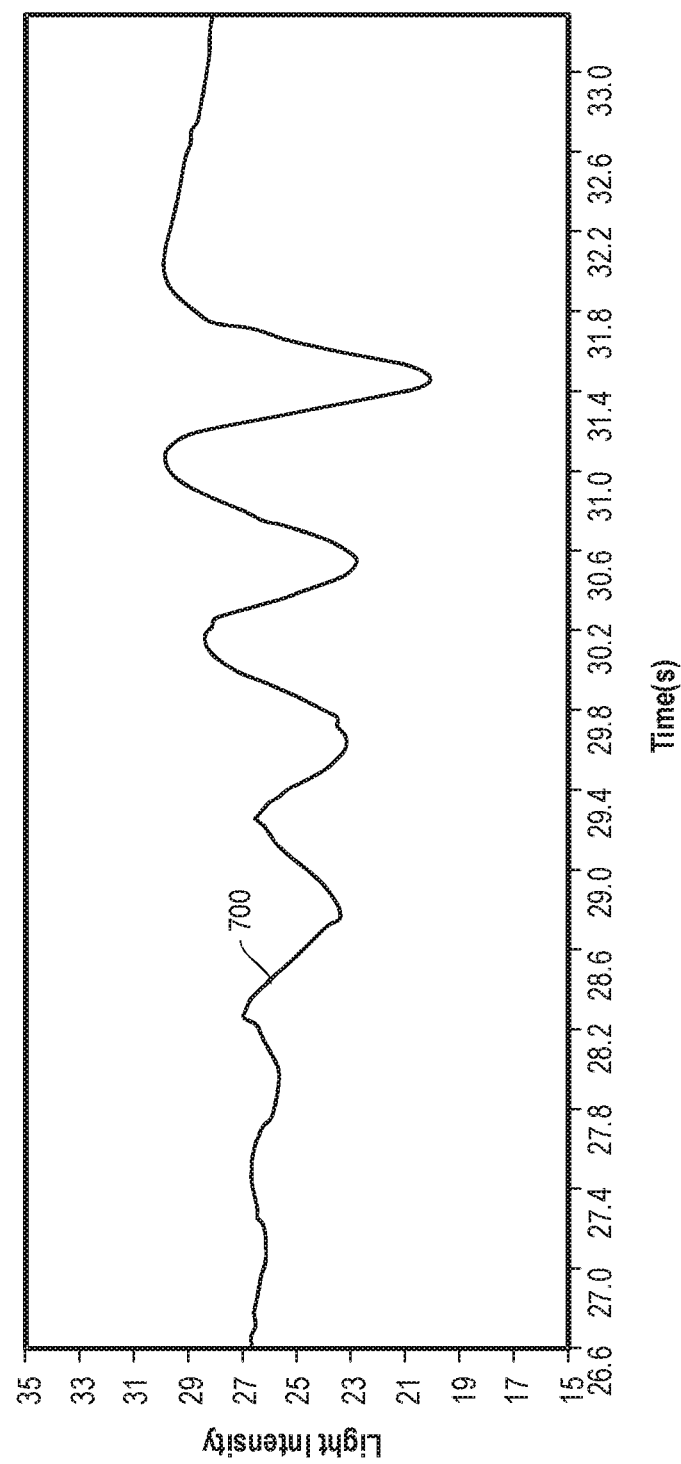
FIG. 7 illustrates a plot of an exemplary signal of reflected light as a substrate is coated versus time.

Shown in FIG. 7 is an exemplary plot of signal 700 of all reflected light detected by a camera 90 as a substrate is spin coated over time. As seen by signal 700, as time progresses, peaks and troughs in the intensity value of the reflected light occurs as the film dries and the reflectivity changes. A wide range of characteristics of the reflection signal may be utilized to characterize and monitor the coating process, including but not limited to the amplitude of the various peak to trough readings, the placement of the peaks and troughs, and the way in which the sinusoidal period changes throughout the process. Moreover, more in depth data processing of the signal data may be performed, including but not limited to various kinds of transforms to the signal (Fourier, Laplace, etc.) and looking for characteristics in those data sets that might allow for a more clear analysis of a characteristic nature to a given film thickness and/or coating process. Further, it is noted that in the example signal 700 of FIG. 7, the data collected is for all wavelengths of visible light. However, the data may be broken down into RGB components or even analyzed at a single wavelength or some sub-set of wavelengths.

Figure 8:
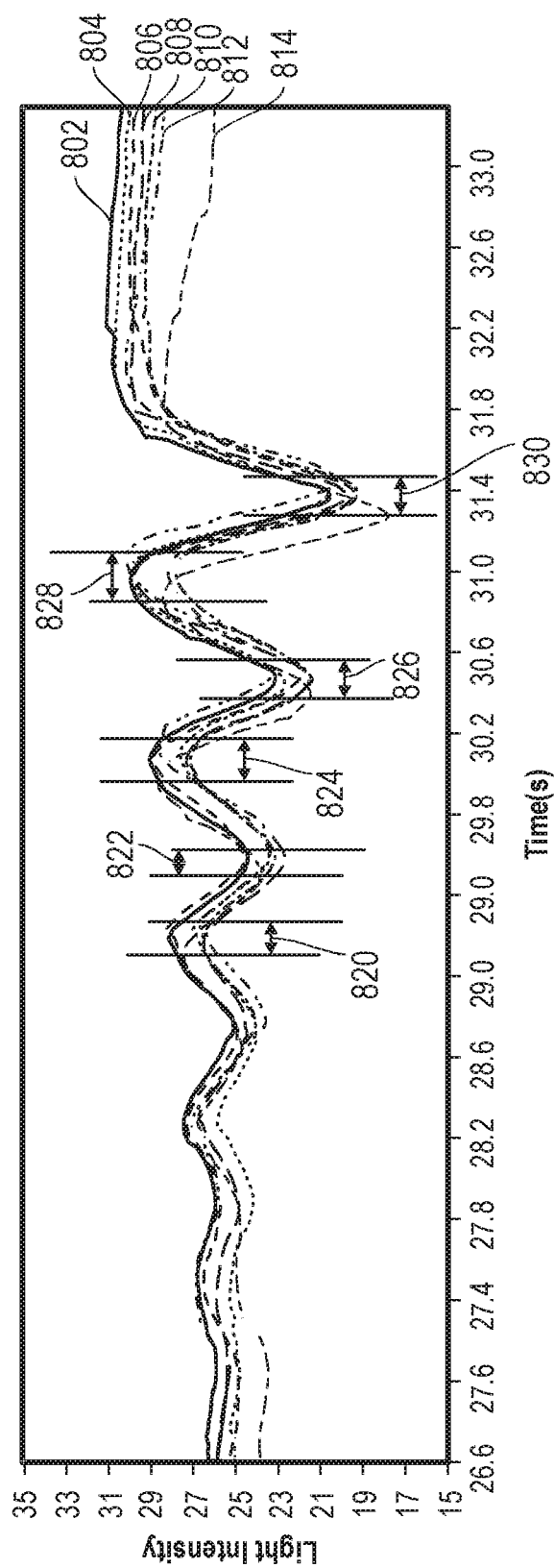
FIG. 8 illustrates plots of exemplary signals of reflected light as a substrate is coated versus time for seven different substrates.

In one embodiment, the spin coating process may be characterized and monitored to establish substrate to substrate film thickness variations by tracking the placement of the peaks and/or troughs along a time axis. FIG. 8 illustrates the reflection data of seven different substrates during a spin coating process. In the example of FIG. 8, five substrates are processed with the same standard process. Typical standard processes utilize a casting RPM of 1200 to 1800 RPMs. The reflectivity light intensity over time is shown in plots 802, 804, 806, 808, and 810 respectively. Two substrates are spin coated at different spin speeds. One substrate is coated at an increased RPM of +50 RPM (as compared to the standard process) and is indicated by plot 814. Another substrate is coated at a decreased RPM of −50 RPM and is indicated by plot 812.

In the example of FIG. 8, the signal from an image camera is converted from RGB to greyscale intensity. The greyscale intensity may then be averaged over the substrate area and plotted through time. It is noted that the intensity (vertical axis) may be significantly different between the substrate runs, even if the same process is utilized. This may result from the use of different fluid dispense systems and the light level inside the cup not being constant, among other factors. However, it is noted that the horizontal placement of the peaks and troughs are very similar for all five cases in plots 802, 804, 806, 808, and 810. The noise in the time at which each peak or valley occurs is on the order of the frame rate. For the cases where the rotation speed during drying was altered by 50 rpm (plot 812 and plot 814) the peaks and valleys have shifted indicating that a change in the final thickness will be present. The ratio of this signal to noise is used to judge the smallest thickness change capable of being detected.

It is noted that the decreased and increased RPM processes provide approximately ±1.5% film thickness differences. In the example shown, a 0.5 nm mean thickness change may result by changing the RPMs by 50 RPMs. The time sensitivity corresponds to roughly 0.15 seconds time shift equaling approximately 1 nm film thickness change. Depending upon the noise in the signal differing amounts of thickness changes may be detected by monitoring the time shift. In one embodiment, thicknesses changes of greater than 0.3 nm may be detected by monitoring the time shift in the signal.

Figure 9:
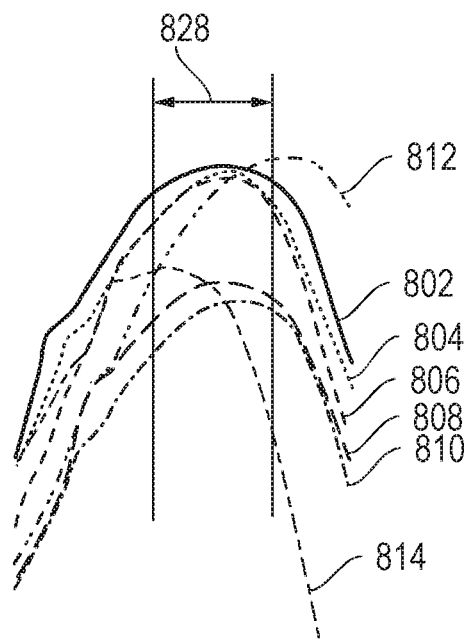
FIG. 9 illustrates an expanded view of a portion of the plots of FIG. 8.

As indicated by the plots 802, 804, 806, 808 and 810, the results from substrates coated according to the same process indicate that a repeatable signal may be obtained substrate to substrate. As shown in FIG. 8, the signals obtained from substrates processed at different RPMs provide displacement from the standard process on the time axis. More specifically, the displacement of the peaks and troughs between plot 812 and plot 814 is indicated by arrows 82o, 822, 824, 826, 828, and 830 in FIG. 8. This displacement can be used to detect the difference in film thickness. FIG. 9 illustrates an expanded view of the time between 30.6 and 31.5 s on the graph of FIG. 8, illustrating the displacement 828. As also can be seen from FIG. 9, though the value of the peaks of plots 802, 804, 806, 808 and 810 may vary, the time occurrence of the peaks is very repeatable for the same standard baseline condition. Moreover, a clear resolution of the peaks for the films cast at different spin speeds (and thus associated film thickness variations) may be obtained. Thus, even though the peak value of the intensity from substrate to substrate may show significant variation and noise, the time placement of the peak may be utilized to characterize and monitor a particular spin coating process. In this manner, reflected intensity data over time is obtained for a plurality of substrates and the monitoring and/or characterizing includes comparison of reflected intensity data of a plurality substrates.

In this manner, the detected reflection data obtained by a camera in a spin coating chamber may be utilized to monitor and characterize the spin coating process in real-time. Further, such data may be provided to a controller such as controller 94 for collection, recordation, analysis, process control, etc. Moreover, the data analysis may be performed in a wide range of manners and is not limited to that discussed in relation to FIGS. 7-9. For example, in the discussion above the time resolution of one single peak was described. However, a more detailed analysis can identify multiple (or even all) of the peaks and the troughs in the signals and use some (or all) of them in a similar manner in order to provide more data for the metric. In this way, one may employ a series of time steps for the peaks and troughs as well as the time increments between these peaks and troughs to create a fingerprint for a given film coating on a given substrate. Further, data analysis could be accomplished by removing one of the RGB channels from the analysis or even specific wavelengths may be utilized to accomplish the analysis. Thus, light source 92 may be configured with specific desired wavelength(s), and the best one could be used for a given film/substrate configuration. Alternatively, filtering of the collected reflectivity wavelength data may be accomplished in the camera or even performed by software in the controller. Thus, the system could be configured to expose and capture a spectrum of wavelengths which are analyzed. Complex signal processing on the recorded signal may also be performed by the controller in order to remove certain noise sources and improve the signal to noise ratio.

Figure 10:
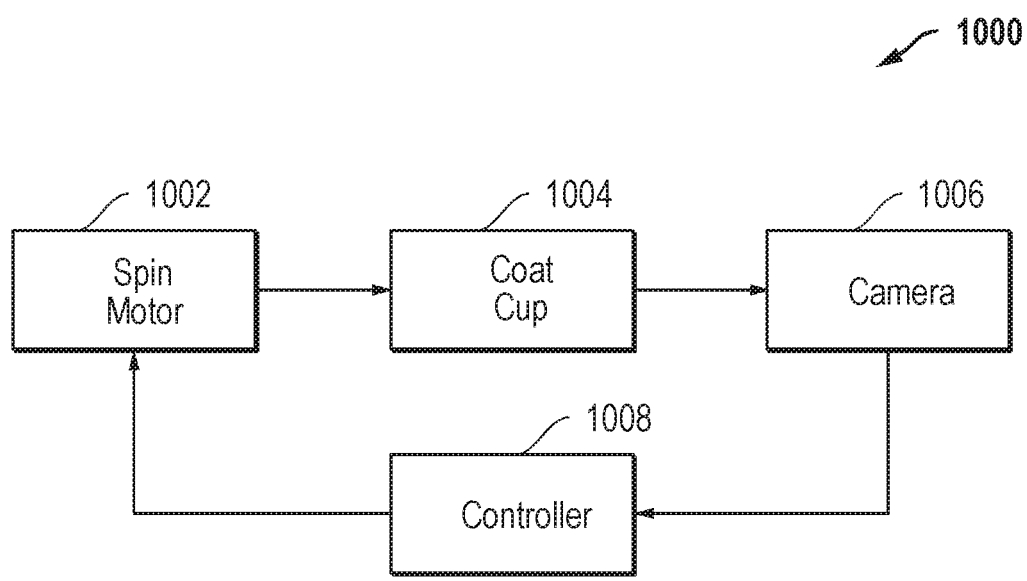
FIG. 10 illustrates an exemplary control loop for using a camera in a fluid dispense system.

The data collected according to the techniques described above may be utilized to monitor and/or characterize a process, particularly for identifying variations from substrate to substrate or detecting the occurrences of faults or excursions in a coating process. However, as the data may be collected in real-time during the spin coating process, the data may also further be utilized to provide real-time control of the spin coating process. More specifically, a well-known relationship of spin speed to film thickness is that thickness is proportional to one over the square root of the spin speed. Therefore, since real-time film thickness difference data may be obtained, a control loop may be provided whereby the spin speed may be corrected during spin processing to obtain a correct film thickness. FIG. 10 illustrates an exemplary control loop. As shown in FIG. 10, a feedback control process 1000 may be provided. As shown in FIG. 10, a spin motor control block 1002 impacts the coating obtained in a coat cup control block 1004 which is monitored by a camera control block 1006. Data from the camera control block 1006 is feedback to a controller block 1008 which may provide feedback control to the spin motor control block 1002 so as to adjust the spin speed in real-time so as to adjust the final thickness of the film. In this manner real-time monitoring of the reflectivity data obtained by a camera 90 may be utilized to provide real-time film thickness control during the application of a film in a fluid dispense system 60 as shown in FIG. 1.

Data Analysis Techniques for Spinning Patterned Reflective Substrates

In another embodiment of the use of a camera within a fluid dispense system, reflected light intensity is obtained as a function of time as a substrate is spin coated and signal processing techniques are performed to account for movement within the system. In one embodiment, the signal processing helps minimize the effects on light reflections caused by the movement of the pattern on the substrate that underlies the spin coated material. The signal processing techniques utilized may include data smoothing, analyzing only certain wavelengths of reflected energy, transforming the data (in one embodiment utilizing a Fourier transform), and/or analyzing a sub-set of the collected pixels of data.

More specifically, as described above, reflectivity data may be collected within a fluid dispense system 60 utilizing a camera 90. However, the analysis of the collected data may be complicated by movement of various components within the fluid dispense system and also by the existence of patterns on the substrate being coated. In one embodiment, data analysis techniques may be utilized to remove or minimize the impact of moving parts above the substrate and/or changes in reflections caused by the underlying patterns that exist on the substrate being coated which vary in orientation as the substrate spins. In one embodiment, the image frame obtained when the coating material first exits the dispense nozzle is identified. Starting at that point, a plot of reflection intensity through time may be generated for any pixel of the video image that contains the substrate. The data may then be smoothed and/or transformed to minimize higher frequency noise due to reflections from the varying orientations of circuit patterns on the substrate. Analysis may be used to determine which wavelengths of light and which pixels should be included to achieve the best signal to noise. The peaks and valleys in the reflection curves may then recorded and compared with the previous substrates to determine any shift in thickness as described above and/or used to control the fluid dispense system in real-time as also described above.

In order to compare the timing of the peaks and troughs that are described above, it is desirable to ensure that the data in the intensity vs time chart is collected starting at the same moment at every substrate. This may be done in a wide range of manners. In one approach, edge detection threshold are set to observe differences between an image frame before dispense and an image frame after dispense. First the movement of the dispense arm to the target position may be signaled by having a certain number of pixels detecting the arm in certain target areas. Then, the dispense is detected by looking at the difference between frames and counting a specified number of pixels in a target area where the dispensed material is to be located.

Figure 11:
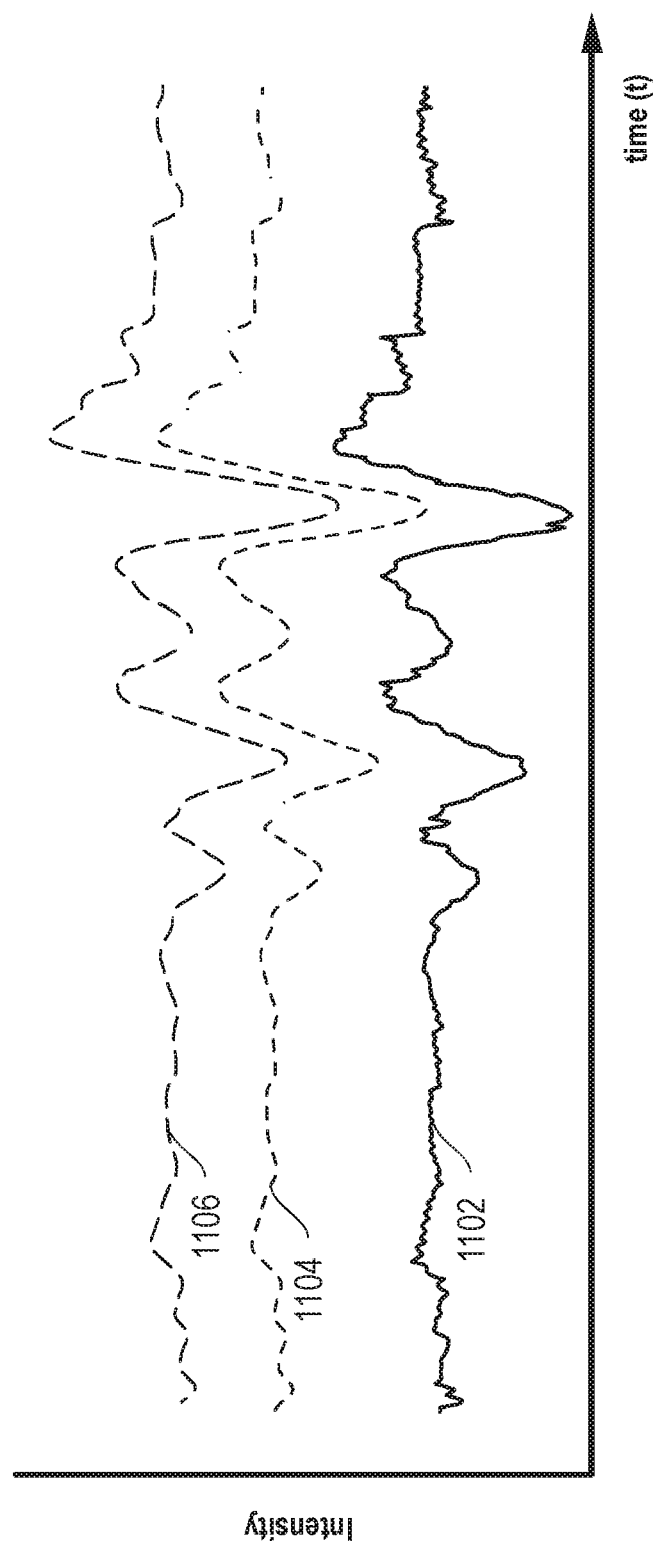
FIG. 11 illustrates exemplary smoothing of signal of reflected light as a substrate is coated versus time.

In the case of substrates with reflective patterns on the substrate, it can be much more difficult to discern a signal. The variation in intensity from the changing orientation of the substrate can exceed the color change from the changing thickness. To solve this problem, multiple techniques may be employed. In one embodiment, the data may be filtered to smooth the data until the separation of each peak and valley falls within an expected range. For example, as shown in FIG. 11, an original signal 1102 may be subjected to a data smoothing algorithm. Two examples of a smoothed signal as shown by signals 1104 and 1106 which are shown on the same time axis (though shifted on the intensity axis merely for ease of illustration). The resulting smoothed signals may be better suited for examination of the peaks and troughs as the filtered data removes much of the noise in the system as shown.

In another embodiment, certain wavelengths may be removed from the signal as part of the data processing so that the peaks and troughs may more accurately be compared for establishing thickness changes. For example, in one embodiment, the red, blue, or green wavelengths signals from the camera image can be individually turned off before converting the signal to greyscale. The desired signals to remove may vary depending on the diffraction of the underlying pattern. In one embodiment, all seven permutations of the potential RGB signals may be evaluated to establish which permutation provides the highest signal to noise ratio for a particular underlying pattern.

Figure 12A:
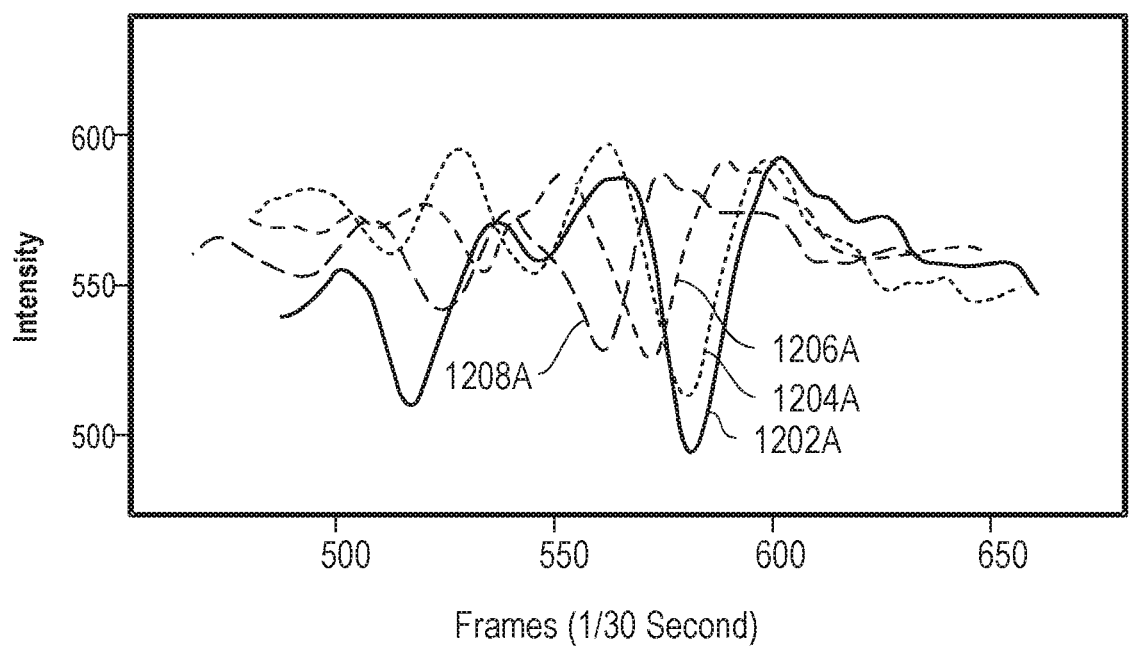
FIGS. 12A and 12B illustrate exemplary effects of removing a wavelength(s) from the exemplary signal of reflected light as a substrate is coated versus time.
Figure 12B:
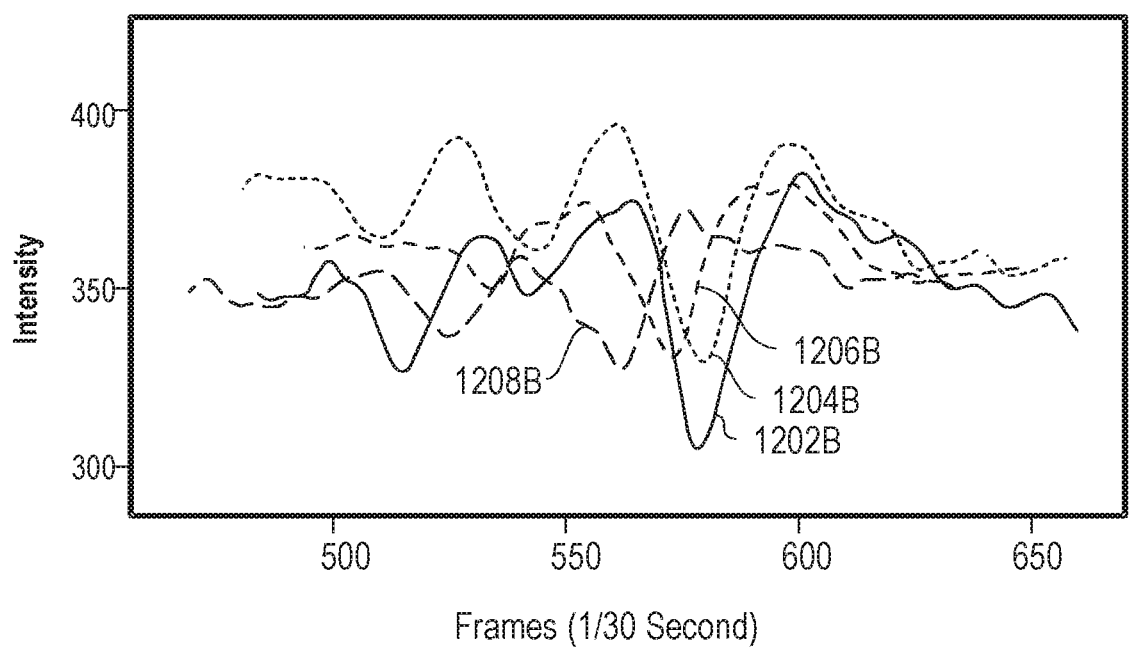

FIGS. 12A and 12B illustrate an exemplary effect of removing a wavelength. FIG. 12A illustrates data using all wavelengths. FIG. 12B illustrates data having the green wavelength band (wavelengths 534-545 nm) removed. As shown in FIG. 12A, three signals are obtained from a common process, signals 1202A, 1204A, and 1206A. One signal is obtained by adjusting the common process by increasing the spin speed by 50 RPMs. FIG. 12B shows the data for the three signals from the common process with the green removed, signals 1202B, 1204B, and 1206B. Data from the process having the spin speed increased by 50 RPMs is shown as signal 1208B. As shown in FIGS. 12A and 12B, removal of the green band improves the identification of the peaks and/or troughs. In the example, the noise is reduced for a 1 nm thickness change from approximately 0.2 seconds to 0.1 seconds.

Figure 13:
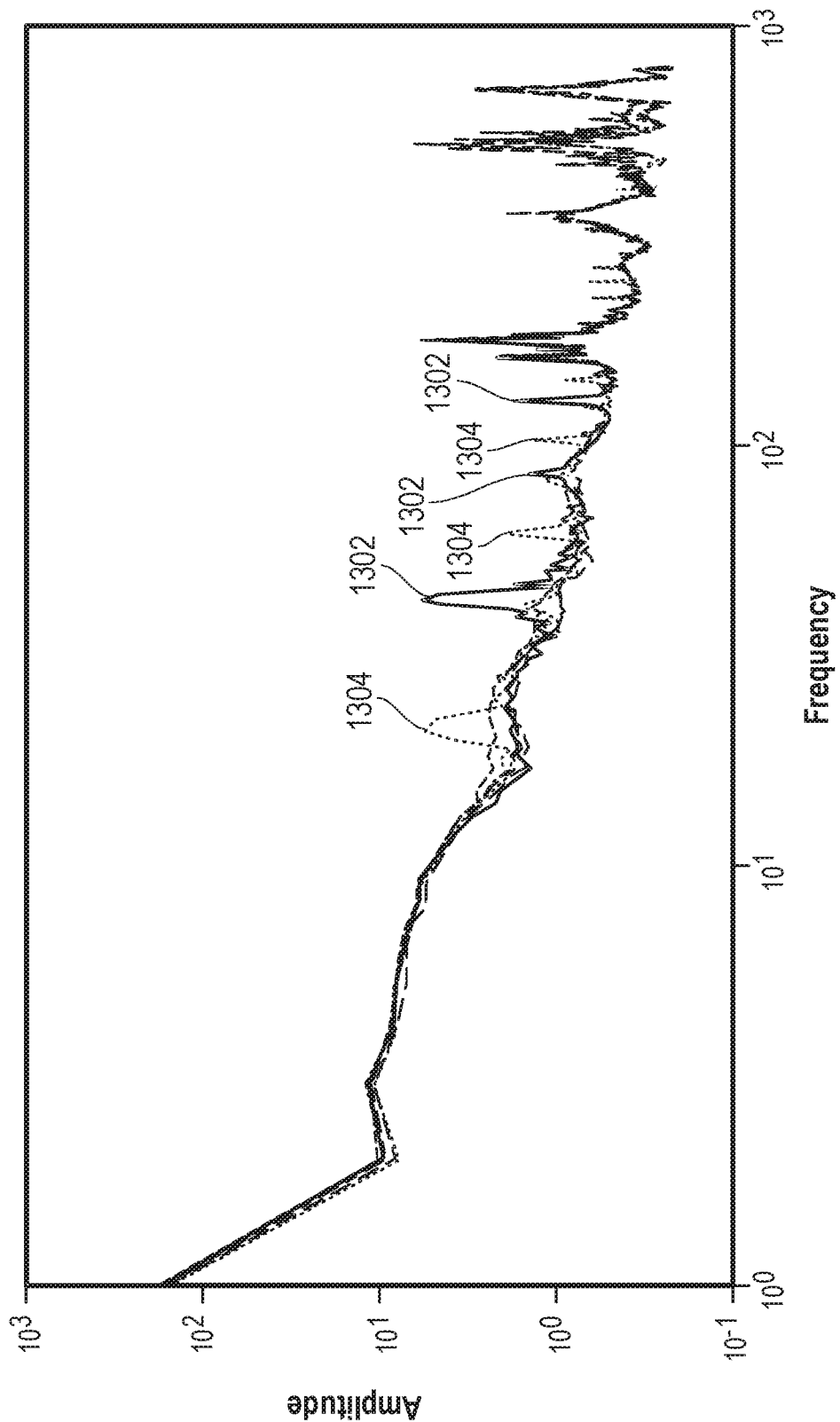
FIG. 13 illustrates the effect of a Fourier transform of signal of reflected light as a substrate is coated versus time.

In yet another embodiment, noise introduced by variability between the frame rate of the camera and the rotation speed of the substrate may be addressed. More specifically, depending upon the rotation speed and the frame rate, each frame may be obtained for a different orientation of the patterned substrate. Such differences will create noise in the detected signals. This mismatch generates a cyclical fluctuation in intensity with a relatively constant frequency. Thus, it is desirable to identify and remove this added color change that results from the mismatch. This noise may be addressed by utilizing a Fourier transform to remove substrate orientation effects as the cyclical fluctuation in intensity with a relatively constant frequency can be observed as a peak in the Fourier transform. By setting the undesired frequencies to zero and performing the inverse Fourier transform the impact of the frame rate mismatch can be removed. For example, for a frame rate of 30 frames per second (fps) and substrate rotation speeds of 1200 or 1800 RPMs mismatch will not occur. However, for rotation speeds of 1750 and 1775 RPMs, mismatch may occur. FIG. 13 illustrates data from eight substrates, six collected at either 1200 or 1800 RPMs and one at 1750 RPMs and one at 1775 RPMs. The Fourier transform of the intensity vs time curve is shown in FIG. 13. As shown in FIG. 13, the Fourier transform of the curve readily illustrates the frequencies of the undesired reflections for the 1750 RPM signal, at points 1302, and the 1775 RPM signal at points 1304.

Another noise reduction method examines the intensity through time image data pixel by pixel. Specifically, certain locations on the patterned substrate may provide higher noise then other locations. Analysis may be performed to identify locations on the substrate which are less noisy and those locations may be utilized for the film thickness techniques described herein. Thus, though the image data may comprise a plurality of pixels, the pixels of the image that correspond to the location where less noise is observed may be utilized for the film thickness techniques. One method to establish which pixels to utilize for a specific patterned substrate involves analyzing the substrate when the deposited film is dry. For such a substrate, the intensity is expected to be relatively stable. By monitoring the image data from a spinning dry substrate, the variation amongst pixels of the image may be determined. The pixels having high variation accordingly correspond to the pixels that are more affected by undesired reflections from the underlying pattern. Any pixel that exceeds a variation threshold, as determined by standard deviation through time or the presence of undesired frequencies in a Fourier transform corresponding to systematic reflections, may be removed from the calculation of average intensity. In this way, particular pixels, or groups of pixels may be removed from the analysis to reduce the noise in the image data and the process proceeds by analyzing only image data from a sub-set of the plurality of pixels of the camera.

Figure 14:
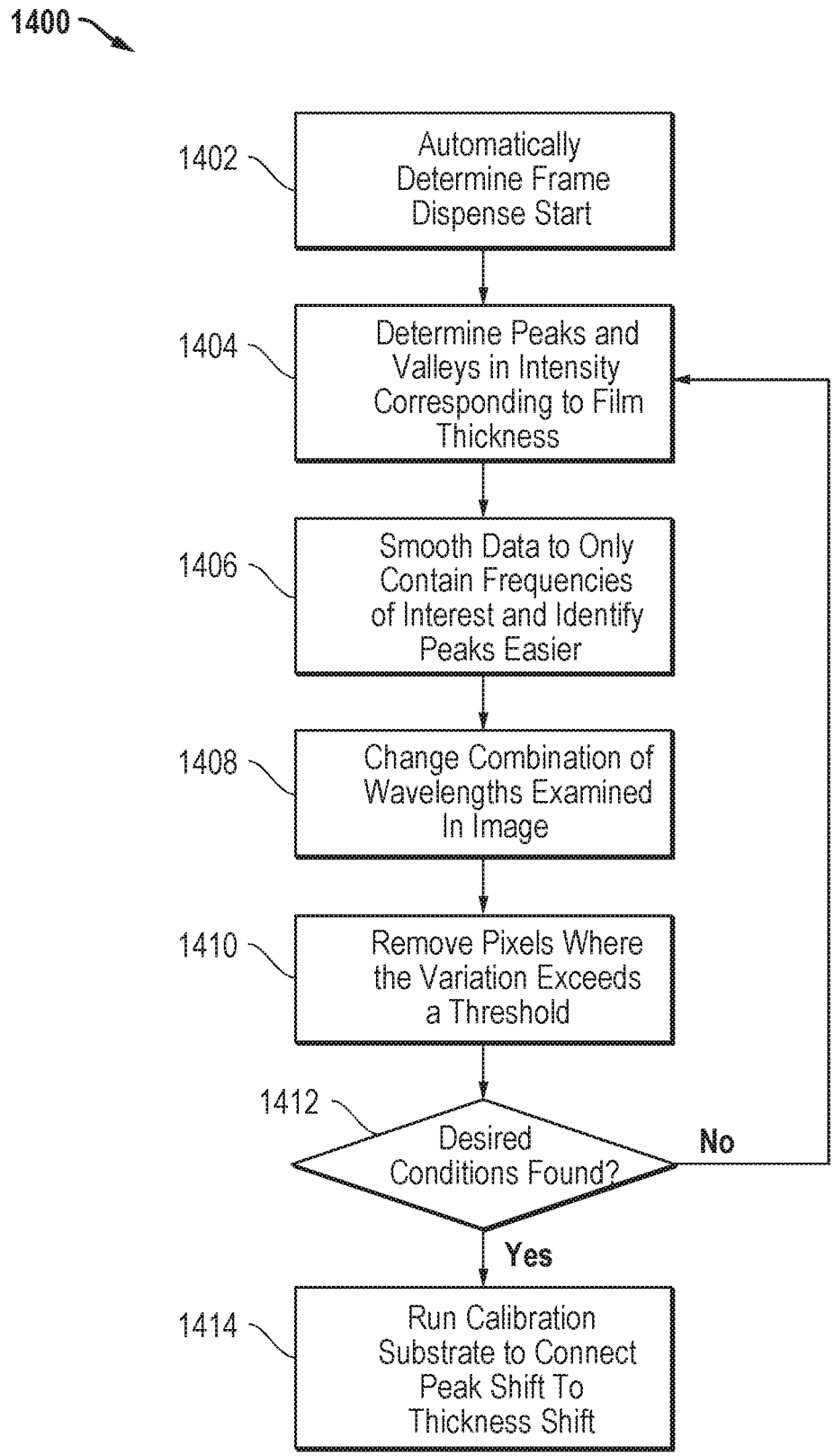
FIG. 14 illustrates an exemplary camera image analysis process.

As described above, a variety of data analysis techniques for analyzing a spinning patterned reflective substrates during a formation of a film upon the substrate have been provided. Each of these techniques may be utilized individually to provide an improved analysis approach. Alternatively, various combinations of the techniques may be utilized. Thus, as described herein, the techniques may be utilized singularly or in combination. In one embodiment, an image analysis process for use with a spin coating process may be utilized together a grouping of these techniques as described in FIG. 14. As shown in FIG. 14, a camera image analysis process 1400 is provided. First, in step 1402 the frame at which dispense states may be determined. Then, an optimization loop comprised of step 1404, step 1406, step 1408 and step 1410 may be performed (once or more often) until desired conditions are found at step 1412. More specifically, at step 1412 conditions are found such that noise from movement in the system has been sufficiently removed such that peak or trough shifts may be identified that correspond to thickness shifts on the substrate. More specifically, step 1404 comprises determining peaks and valleys in intensity corresponding to film thickness. Then, step 1406 comprises smoothing data to only contain frequencies of interest and identify peaks easier. Then, step 1408 comprises changing the combinations of wavelengths examined in the image. Then, step 1410 comprises removing pixels where the variation exceeds a threshold. Steps 1401, 1406, 1408 and 1410 may be repeated until an desired condition is found as indicated by the decision block of step 1412. When desired conditions are found, then step 1414 comprising running a calibration substrate to connect peak shifts to thickness shifts may be performed. As mentioned above, it will be recognized that in some embodiments only a subset of the optimization steps of step 1404, step 1406, step 1408, and step 1410 may be utilized. Furthermore, the order shown for step 1404, step 1406, step 1408, and step 1410 is merely exemplary, and the order of the steps may be rearranged. In this manner, one or more techniques for improving the image analysis of a spinning substrate while that substrate is being coated with a film may be utilized.

Process Control Techniques for Film Thickness Control Utilizing Fluid Dispense System Camera and Other Process Variables for Detecting Process Variations Including Viscosity Changes The camera image data collected herein may be combined with a wide variety of other data so as to better monitor, characterize and/or control a substrate processing process flow. In one example, the camera image data may be combined with data collected from a WIS. In another embodiment, the camera image data may be combined with other data collected from the other fluid dispense system components. Still further, the image data may be combined with other data such as data related to the source of the liquid being dispensed (which liquid source bottle, the liquid source bottle age, etc.).

For example, the techniques described above may be utilized to determine film thickness in a fluid dispense system. Further, as mentioned, the techniques may be utilized to identify variability between different substrates processed fluid dispense systems. In addition, the techniques described may be utilized to provide real-time control of a fluid dispense system so as to obtain a desired film thickness. A wide range of variations in process variables may cause the changes seen in film thickness. These variations may include variations in the incoming substrates to be processed, variations in the performance of the process equipment (inaccuracies/changes in spin speed, temperature, dispense volume, etc.), and variations in the material being dispensed. One variable related to the material being dispensed is viscosity. Material viscosity may change for a number of reasons. For example, a supply tank or bottle may be the source of the liquid material supplied to the fluid dispense system. When a new bottle is utilized as a source, the viscosity may vary from the prior bottle. Further, the viscosity from the source may change over time.

To better provide better process control to the overall substrate process flow to account for process variations discussed, the camera image data obtained from the fluid dispense system may be combined with other data obtained from the substrate and/or process equipment during the process flow. For example, as mentioned above, a substrate may move to a WIS after coating the material in the fluid dispense system. In many cases the WIS typically is utilized in the substrate process flow after the substrate has been coated and subjected to a PAB unit. A camera configuration similar to that described with regard to the fluid dispense system 60 may be utilized to provide an image for color analysis of the substrate in the WIS. The color analysis may provide information as to the thickness of the coating. Such information may not include the time variation of the spin drying process described above and may be more susceptible to underlying substrate variability. However, the color image data obtained in the WIS does account for the overall coat and bake process.

By combining the image data obtained from the fluid dispense system with data subsequently obtained in a WIS, more detailed information may be provided for determining film thickness, providing process control and/or determining if an issue which should be flagged has occurred in the process flow.

Figure 15:
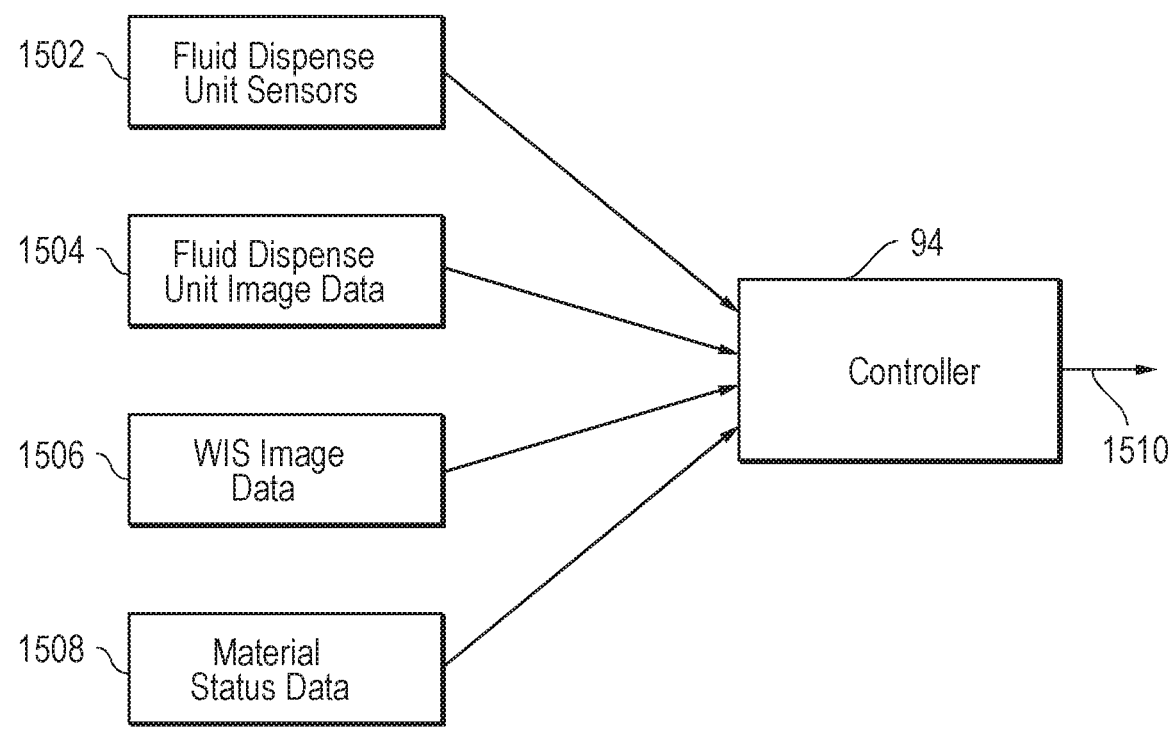
FIG. 15 illustrates an exemplary combination of camera image data with other process data.

Moreover, other data collected from the process flow may also be combined with the WIS image data and the fluid dispense system image data. For example, various parameters may be obtained from sensors in the fluid dispense system (spin motor data, temperature, dispense time, etc.). In addition, data as to the status of the material being deposited may be obtained (bottle change, age of bottle, etc.). All such information may then be combined (or a sub-set of the information) so as to provide better process control, characterization and monitoring of the film formation process flow. One exemplary process control configuration is shown in FIG. 15. As shown in FIG. 15, data may be collected from non-camera sensors of the fluid dispense system as shown by block 1502. Fluid dispense system image data from the camera may be collected as shown by block 1504. WIS image data may be collected as shown by block 1506. Material status data may be collected as shown by block 1508. As shown in the figure, all of the collected data may be provided to the controller 94 (such as the controller 94 shown in FIG. 1). The controller 94 may then provide an output 1510 based upon analysis of all the data provided. The output 1510 may be utilized to provide control signals to some aspect of the process flow (for example adjustments to various process variables), may be utilized to flag the existence of some process deviation or fault, may be merely collected for future analysis/characterization of the process, etc. In this manner, a more complex analysis of the film formation process may occur utilizing the image data of the fluid dispense system as one piece of the data being analyzed. It will be recognized that all of the data illustrated in FIG. 15 need not be utilized, but rather a sub-set of data may be utilized. For example, in another embodiment, only data from the fluid dispense system sensors, the fluid dispense system image data and the material status data may be utilized. It will be recognized that other combinations of data with the fluid dispense system image data may also be utilized, including combinations with data sources not shown.

It will be recognized that the substrates described herein may be any substrate for which the substrate processing is desirable. For example, in one embodiment, the substrate may be a semiconductor substrate having one or more semiconductor processing layers (all of which together may comprise the substrate) formed thereon. Thus, in one embodiment, the substrate may be a semiconductor substrate that has been subjected to multiple semiconductor processing steps which yield a wide variety of structures and layers, all of which are known in the substrate processing art, and which may be considered to be part of the substrate. For example, in one embodiment, the substrate may be a semiconductor wafer having one or more semiconductor processing layers formed thereon. Although the concepts disclosed herein may be utilized at any stage of the substrate process flow, the monitoring techniques described herein may generally be performed before, during or after a substrate is subject to a fluid dispense operation.

FIGS. 16-21 illustrate exemplary methods for use of the processing techniques described herein. It will be recognized that the embodiments of FIGS. 16-21 are merely exemplary and additional methods may utilize the techniques described herein. Further, additional processing steps may be added to the methods shown in the FIGS. 16-21 as the steps described are not intended to be exclusive. Moreover, the order of the steps is not limited to the order shown in the figures as different orders may occur and/or various steps may be performed in combination or at the same time.

Figure 16:
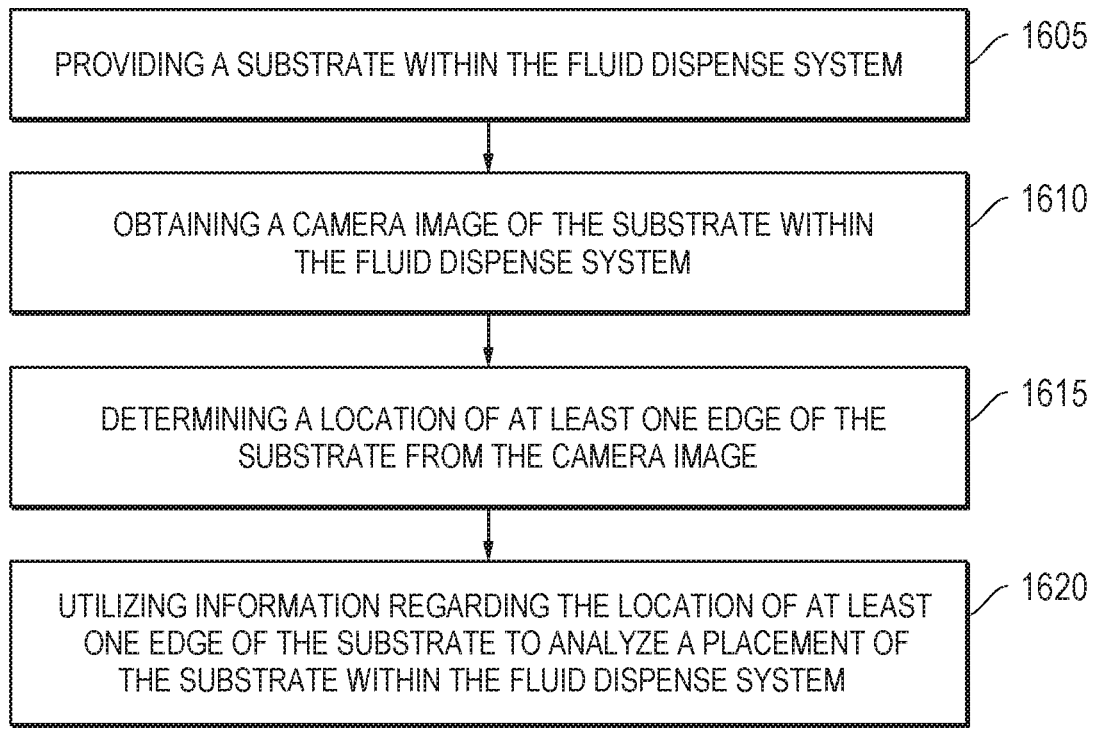
FIGS. 16-21 illustrate exemplary methods of utilizing the techniques described herein.

FIG. 16 illustrates an exemplary method of monitoring one or more characteristics of a fluid dispense system. The method includes step 1605 of providing a substrate within the fluid dispense system. The method also includes step 1610 of obtaining a camera image of the substrate within the fluid dispense system. The method also includes step 1615 of determining a location of at least one edge of the substrate from the camera image. The method also includes step 1620 of utilizing information regarding the location of at least one edge of the substrate to determine a placement of the substrate within the fluid dispense system.

Figure 17:
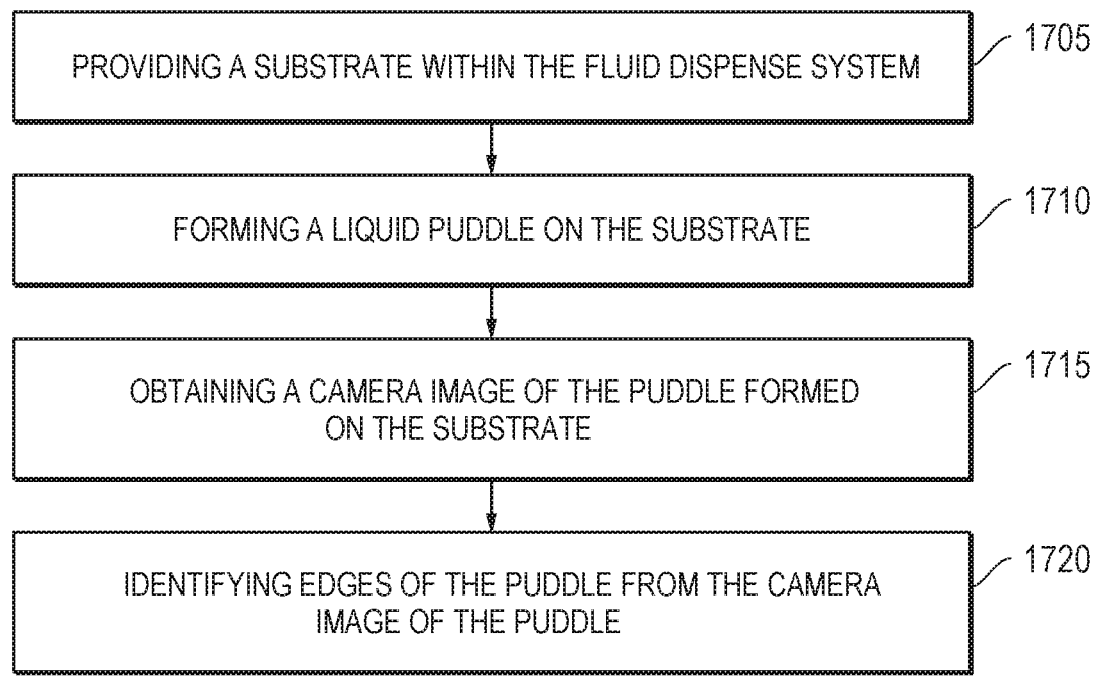

FIG. 17 illustrates an exemplary method of monitoring one or more characteristics of a fluid dispense system. The method includes step 1705 of providing a substrate within the fluid dispense system. The method also includes step 1710 of forming a liquid puddle on the substrate. The method also includes step 1715 of obtaining a camera image of the puddle formed on the substrate. The method also includes step 1720 of identifying edges of the puddle from the camera image of the puddle.

Figure 18:
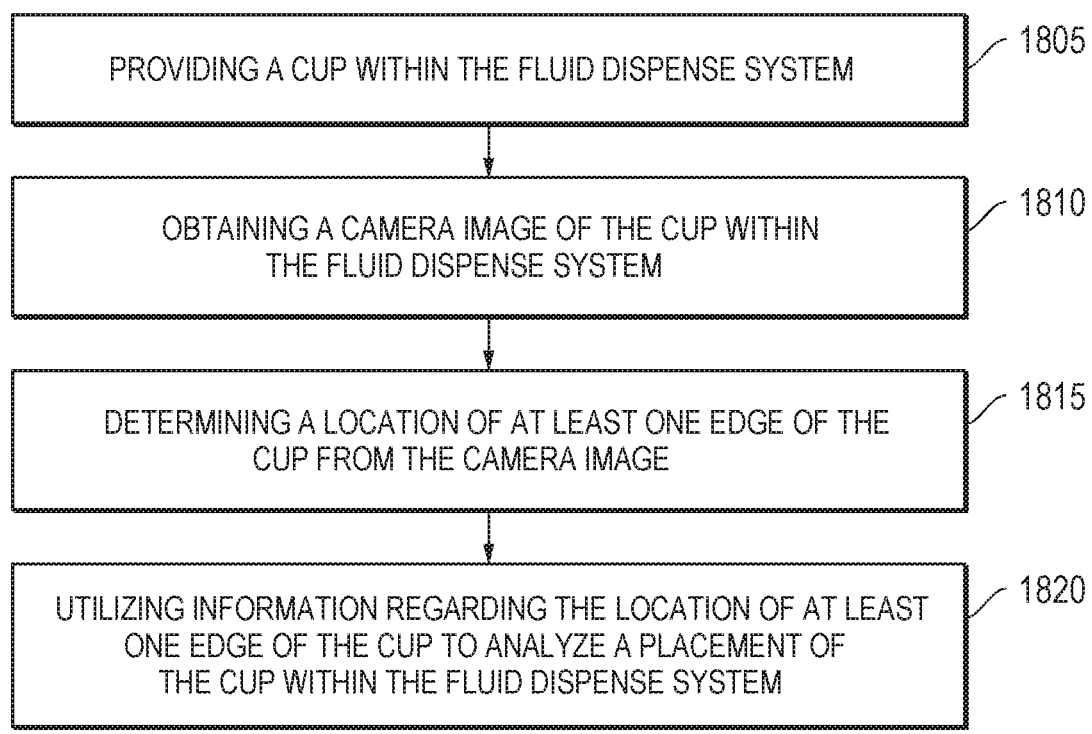

FIG. 18 illustrates an exemplary method of monitoring one or more characteristics of a fluid dispense system. The method comprises step 1805 of providing a cup within the fluid dispense system. The method also includes step 1810 of obtaining a camera image of the cup within the fluid dispense system. The method further includes step 1815 of determining a location of at least one edge of the cup from the camera image. The method also includes step 1820 of utilizing information regarding the location of at least one edge of the cup to analyze a placement of the cup within the fluid dispense system.

Figure 19:
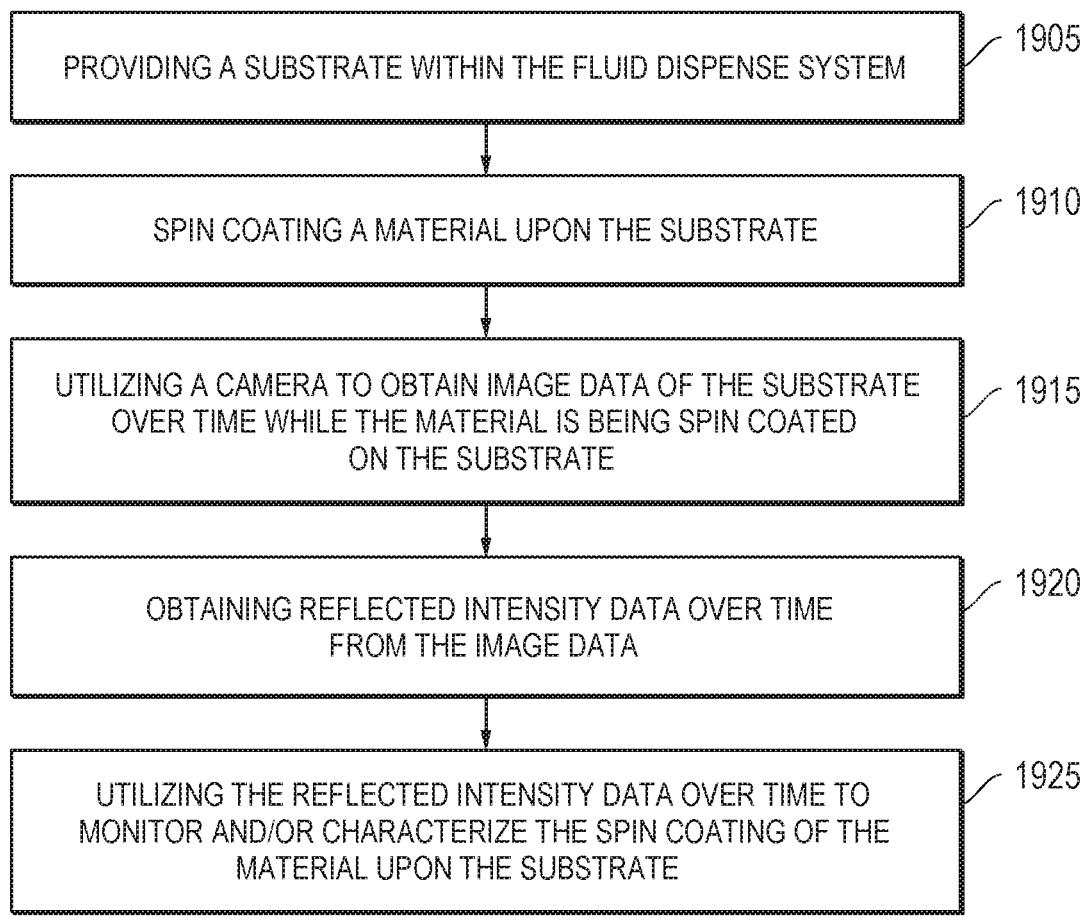

FIG. 19 illustrates an exemplary method of monitoring one or more characteristics of a fluid dispense system. The method comprises step 1905 of providing a substrate within the fluid dispense system. The method also includes step 1910 of spin coating a material upon the substrate. The method further includes step 1915 of utilizing a camera to obtain image data of the substrate over time while the material is being spin coated on the substrate. The method also includes step 1920 of obtaining reflected intensity data over time from the image data. The method further includes step 1925 of utilizing the reflected intensity data over time to monitor and/or characterize the spin coating of the material upon the substrate.

Figure 20:
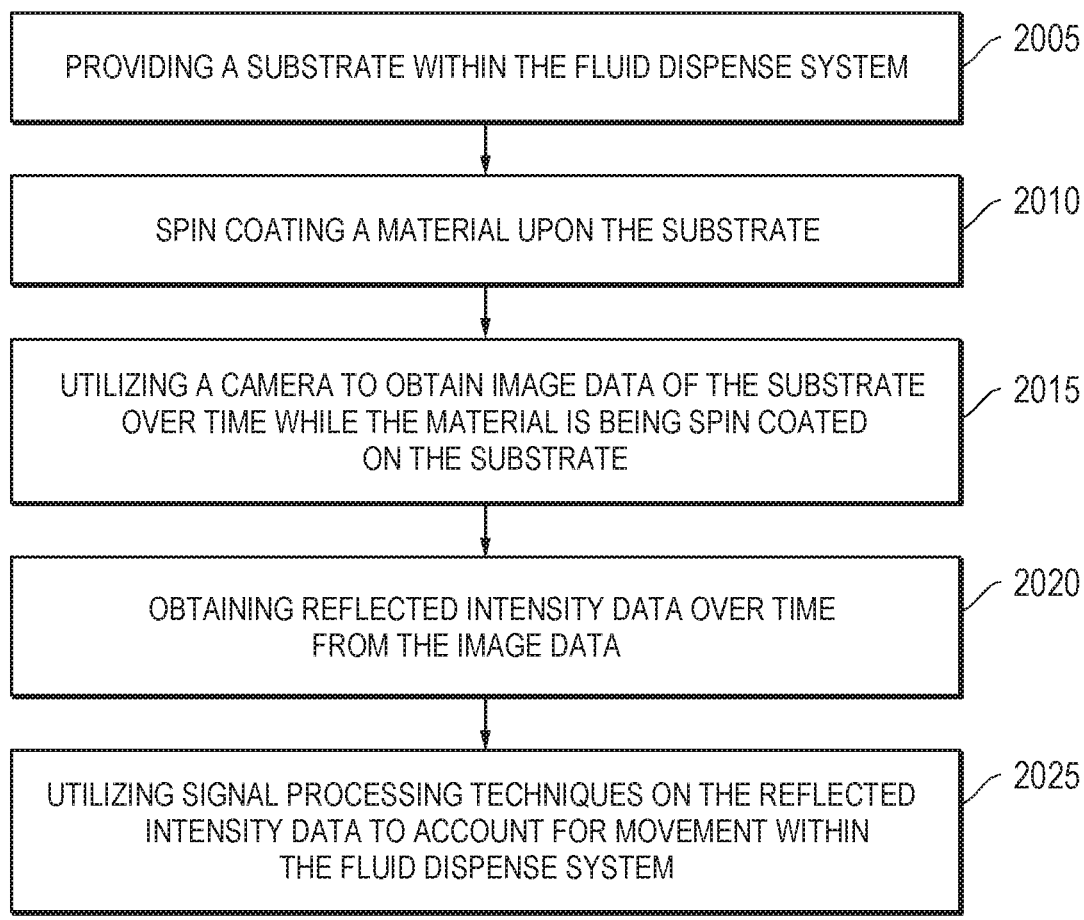

FIG. 20 illustrates an exemplary method of monitoring one or more characteristics of a fluid dispense system. The method comprises step 2005 of providing a substrate within the fluid dispense system. The method also comprises step 2010 of spin coating a material upon the substrate. The method further comprises step 2015 of utilizing a camera to obtain image data of the substrate over time while the material is being spin coated on the substrate. The method also includes step 2020 of obtaining reflected intensity data over time from the image data. The method further includes step 2025 of utilizing signal processing techniques on the reflected intensity data to account for movement within the fluid dispense system.

Figure 21:
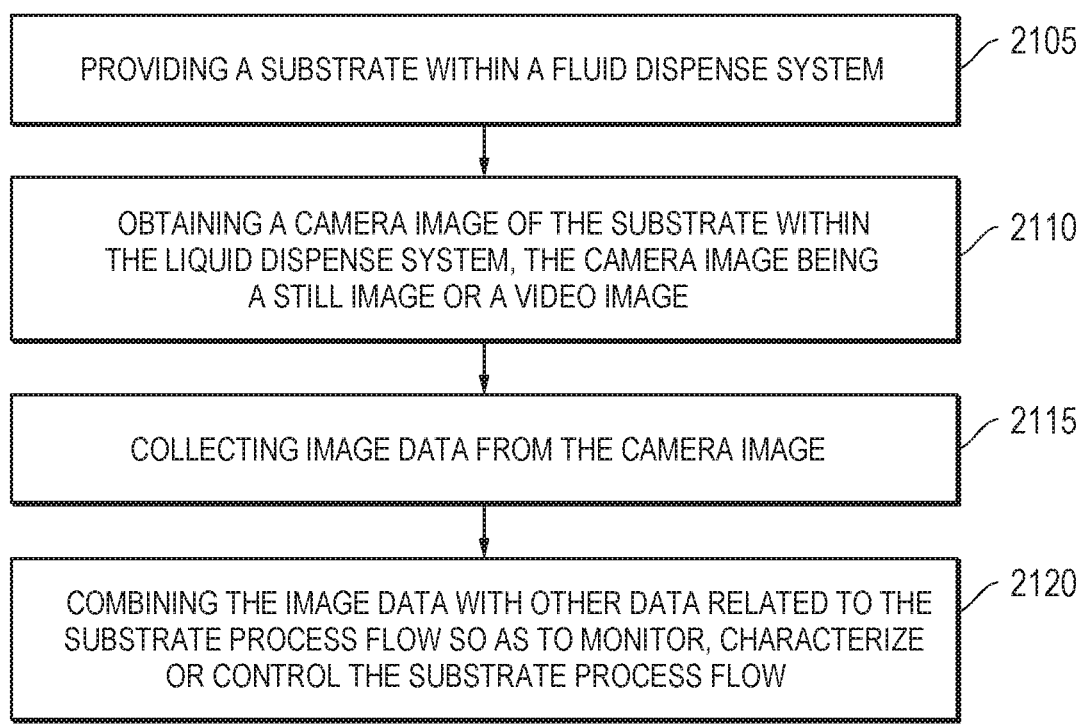

FIG. 21 illustrates an exemplary method of monitoring, characterizing or controlling a substrate process flow. The method comprises step 2105 of providing a substrate within a fluid dispense system. The method also includes step 2110 of obtaining a camera image of the substrate within the fluid dispense system, the camera image being a still image or a video image. The method further includes step 2115 of collecting image data from the camera image. The method also includes step 2120 of combining the image data with other data related to the substrate process flow so as to monitor, characterize or control the substrate process flow.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method of monitoring one or more characteristics of a fluid dispense system, the method comprising:
   providing a substrate within the fluid dispense system;
   obtaining a camera image of the substrate within the fluid dispense system, the camera image comprising a plurality of pixels;
   selecting a subset of pixels from the plurality of pixels;
   determining a location of at least one edge of the substrate from the subset of pixels selected from the camera image; and
   utilizing information regarding the location of at least one edge of the substrate to analyze a placement of the substrate within the fluid dispense system.

2. The method of claim 1, wherein analyzing the placement of the substrate within the fluid dispense system provides information regarding centering of the substrate within the fluid dispense system.

3. The method of claim 2, wherein centering information is provided with relationship to a cup of the fluid dispense system.

4. The method of claim 1, wherein the placement of the substrate within the fluid dispense system is analyzed in relationship to the location of a cup.

5. The method of claim 1, further comprising determining a location of at least one edge of a cup from the camera image.

6. The method of claim 5, wherein analyzing the placement of the substrate within the fluid dispense system provides information regarding centering of the substrate within the fluid dispense system.

7. The method of claim 6, wherein centering information is provided with relationship to the cup of the fluid dispense system.

8. The method of claim 5, further comprising determining a relationship between the at least one edge of the substrate and the cup.

9. The method of claim 1, wherein utilizing information regarding the location of the at least one edge of the substrate to analyze the placement of the substrate within the fluid dispense system comprises determining a relationship between the at least one edge of the substrate and a fixed object of the fluid dispense system.

10. The method of claim 9, wherein the fixed object is a camera that obtains the camera image.

11. The method of claim 9, wherein the fixed object is a cup.

12. The method of claim 9, wherein determining a relationship between the at least one edge of the substrate and the fixed object of the fluid dispense system comprises determining distances from the substrate to at least two edges of a cup.

13. A method of monitoring one or more characteristics of a fluid dispense system, the method comprising:
   providing a cup within the fluid dispense system;
   obtaining a camera image of the cup within the fluid dispense system, the camera image comprising a plurality of pixels;
   selecting a subset of pixels from the plurality of pixels;
   determining a location of at least one edge of the cup from the subset of pixels from the camera image; and
   utilizing information regarding the location of at least one edge of the cup to analyze a placement of the cup within the fluid dispense system.

14. The method of claim 13, wherein analysis of the placement of the cup within the fluid dispense system is performed after replacement of the cup to determine if the cup is properly replaced.

15. The method of claim 13, further comprising determining deviations in a location of the cup based upon the information regarding the location of the at least one edge of the cup.

16. The method of claim 13, wherein determining the location of the at least one edge of the cup from the camera image comprises analyzing an X and/or Y cut plane image detected by the camera.

17. The method of claim 13, further comprising providing an alert when a deviation from an expected cup location is detected.

18. The method of claim 13, wherein utilizing information regarding the location of the at least one edge of the cup to analyze the placement of the cup within the fluid dispense system comprises determining a relationship between the at least one edge of the cup and a fixed object of the fluid dispense system.

19. The method of claim 18, wherein the fixed object is a camera that obtains the camera image.

* * * * *